(12) United States Patent
Uchiyama

(10) Patent No.: US 7,247,914 B2
(45) Date of Patent: Jul. 24, 2007

(54) SEMICONDUCTOR DEVICE AND METHOD FOR FABRICATING THE SAME

(75) Inventor: Keita Uchiyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 11/177,576

(22) Filed: Jul. 11, 2005

(65) Prior Publication Data

US 2006/0043493 A1    Mar. 2, 2006

(30) Foreign Application Priority Data

Sep. 2, 2004    (JP)    ............................. 2004-255406

(51) Int. Cl.
  *H01L 29/76*    (2006.01)
  *H01L 29/94*    (2006.01)
  *H01L 31/062*    (2006.01)
  *H01L 31/113*    (2006.01)
  *H01L 31/119*    (2006.01)

(52) U.S. Cl. .................... 257/369; 257/371; 257/351

(58) Field of Classification Search ........ 257/368–377, 257/347–351, 296–310, 314–316
See application file for complete search history.

(56) References Cited

U.S. PATENT DOCUMENTS 6,727,146 B2 *    4/2004    Murakami et al. .......... 438/275

2005/0242398 A1*    11/2005    Chen et al. .................. 257/348

FOREIGN PATENT DOCUMENTS

JP    2003-347423    12/2003

* cited by examiner

*Primary Examiner*—Cuong Nguyen
(74) *Attorney, Agent, or Firm*—McDermott Will & Emery LLP

(57) ABSTRACT

A semiconductor device includes: a first gate insulating film formed on a first nMOS transistor region in a semiconductor substrate; a second gate insulating film formed on a first pMOS transistor region in the substrate; a third gate insulating film formed on a second nMOS transistor region in the substrate; and a fourth gate insulating film formed on a second pMOS transistor region in the substrate. The first through fourth gate insulating films contain nitrogen. Each of the third and fourth gate insulating films has a thickness smaller than that of each of the first and second gate insulating films. The first gate insulating film has a nitrogen concentration peak at the interface between the first gate insulating film and the substrate. Each of the second, third and fourth gate insulating films has a nitrogen concentration peak only near an associated one of gate electrodes respectively formed thereon.

7 Claims, 13 Drawing Sheets nitrogen profile in
thick gate insulating
film of high-
breakdown-voltage
nMOS transistor nitrogen profile in
thick gate insulating
film of high-
breakdown-voltage
pMOS transistor nitrogen profile in thin
gate insulating film of
high-speed nMOS nitrogen profile in thin
gate insulating film of
high-speed pMOS
transistor nitrogen profile in thick gate insulating film of high-breakdown-voltage nMOS transistor nitrogen profile in thick gate insulating film of high-breakdown-voltage pMOS transistor nitrogen profile in thin gate insulating film of high-speed nMOS transistor nitrogen profile in thin gate insulating film of high-speed pMOS transistor nitrogen profile in thick gate insulating film of high-breakdown-voltage nMOS transistor nitrogen profile in thick gate insulating film of high-breakdown-voltage pMOS transistor nitrogen profile in thin gate insulating film of high-speed nMOS transistor nitrogen profile in thin gate insulating film of high-speed pMOS transistor

SEMICONDUCTOR DEVICE AND METHOD FOR FABRICATING THE SAME

CROSS-REFERENCE TO RELATED APPLICATION

This application claims priority under 35 U.S.C. §119 on Patent Application No. 2004-255406 filed in Japan on Sep. 2, 2004, the entire contents of which are hereby incorporated by reference.

BACKGROUND OF THE INVENTION

The present invention relates to semiconductor devices and methods for fabricating the same, and particularly relates to gate insulating films for metal-oxide semiconductor (MOS) transistors and methods for fabricating the gate insulating films.

In a complementary MOS (CMOS) transistor, for example, among MOS transistors that are typical MOS-type devices, a transistors for high speed driving (hereinafter, also referred to as a high-speed transistor) required to have a relatively thin gate insulating film and a transistor for high breakdown voltage (hereinafter, also referred to as a high-breakdown-voltage transistor) used for input/output signals with relatively high voltages and required to have a relatively thick gate insulating film are formed on a single semiconductor substrate. The gate insulating film of the high-speed transistor needs to have a thickness of about 1 nm to about 3 nm and also imperatively needs to have high reliability in resistance to dielectric breakdown and a low leakage current property.

In CMOS transistors, a dual-gate structure in which boron (B) is used as a dopant for a p-type gate electrode of a p-transistor and phosphorus (P) is used as a dopant for an n-type gate electrode of an n-transistor has been adopted. In this case, B as a p-type dopant has a diffusion coefficient larger than that of P as an n-type dopant, so that B diffuses in a gate insulating film of a high-speed transistor to reach the channel region through processes such as heat treatment during and after formation of the transistor. Such diffusion of B is called "permeation" and greatly changes the threshold voltage of the transistor. In addition, this B permeation becomes more pronounced as the thickness of the gate insulating film is reduced. The B permeation is conspicuous especially when silicon dioxide ($SiO_2$) is used for the gate insulating film. The reduction of thickness of the gate insulating film causes gate leakage current to increase. Specifically, when a $SiO_2$ film with a thickness of 3 nm or less is used as a gate insulating film, direct tunnel current is dominant, resulting in especially noticeable increase of gate leakage current.

As described above, when a $SiO_2$ film is used as a thin gate insulating film of a high-speed transistor, neither B permeation nor increase of gate leakage current is suppressed.

In view of this, oxynitride films (silicon oxynitride films) to which nitrogen is introduced have begun to be used as gate insulating films (see, Japanese Unexamined Patent Publication (Kokai) No. 2003-347423).

FIGS. 7A through 7D and FIGS. 8A through 8D are cross-sectional views illustrating respective process steps of a conventional method for fabricating a semiconductor device (a CMOS transistor) using thermal oxynitridation so as to introduce nitrogen into gate insulating films.

First, as shown in FIG. 7A, a semiconductor substrate 100 in which a first p-well 101, a first n-well 102, a second p-well 103 and a second n-well 104 are formed is subjected to thermal oxidation, thereby forming a first insulating film 106 on the wells 101 through 104. At this time, isolations 105 are provided between the wells 101 through 104 in the semiconductor substrate 100.

Next, as shown in FIG. 7B, a first photoresist film 107 is formed on a portion of the first insulating film 106 located on the first p-well 101 and the first n-well 102. Then, wet etching is performed using the first photoresist film 107 as a mask, thereby selectively removing a portion of the first insulating film 106 located on the second p-well 103 and the second n-well 104. In other words, the first insulating film 106 remains on the first p-well 101 and the first n-well 102.

Then, as shown in FIG. 7C, the semiconductor substrate 100 is subjected to heat treatment in an atmosphere containing nitrogen such as a nitrogen monoxide (NO) gas or a nitrous oxide (dinitrogen monoxide) ($N_2O$) gas. Accordingly, a first gate insulating film 109 is formed on the first p-well 101 and the first n-well 102 out of the first insulating film 106. The first gate insulating film 109 includes a nitridation region 108 having a nitrogen concentration peak at the interface between the first gate insulating film 109 and the semiconductor substrate 100. In addition, a second gate insulating film 110 having a thickness smaller than that of the first gate insulating film 109 is formed on the second p-well 103 and the second n-well 104. As the first gate insulating film 109, the second gate insulating film 110 also includes a nitridation region 108 having a nitrogen concentration peak at the interface between the second gate insulating film 110 and the semiconductor substrate 100.

The nitridation regions are herein regions having relatively high nitrogen concentrations including nitrogen concentration peaks.

Then, as shown in FIG. 7D, a silicon film 111 is deposited over the semiconductor substrate 100 on which the first gate insulating film 109 and the second gate insulating film 110 are formed. Thereafter, as shown in FIG. 8A, a second photoresist film 112 is formed to cover portions of the silicon film 111 respectively located above the first n-well 102 and the second n-well 104. Subsequently, ions of an n-type dopant (impurity) are selectively implanted in portions of the silicon film 111 respectively located above the first p-well 101 and the second p-well 103 by using the second photoresist film 112 as a mask, thereby forming an n-type silicon film 113.

Thereafter, as shown in FIG. 8B, a third photoresist film 114 is formed to cover the portions of the silicon film 111 respectively located above the first p-well 101 and the second p-well 103. Then, ions of a p-type dopant are selectively implanted in the portions of the silicon film 111 respectively located above the first n-well 102 and the second n-well 104 by using the third photoresist film 114 as a mask, thereby forming a p-type silicon film 115.

Subsequently, as shown in FIG. 8C, the n-type silicon film 113 and the p-type silicon film 115 are patterned into gate electrode shapes, thereby forming n-type conductor parts (i.e., a first n-type gate electrode 116 and a second n-type gate electrode 118) out of the n-type silicon film above the first p-well 101 and the second p-well 103, respectively, and also forming p-type conductor parts (i.e., a first p-type gate electrode 117 and a second p-type gate electrode 119) out of the p-type silicon film above the first n-well 102 and the second n-well 104, respectively. The first gate insulating film 109 is interposed between each of the first n-type gate electrode 116 and the first p-type gate electrode 117 and the semiconductor substrate 100. The second gate insulating film 110 is interposed between each of the second n-type gate electrode 118 and the second p-type gate electrode 119 and the semiconductor substrate 100.

Then, as shown in FIG. 8D, source/drain regions 120 made of an n-type doped layer are formed at both sides of the first n-type gate electrode 116 in the first p-well 101 and at both sides of the second n-type gate electrode 118 in the second p-well 103. In addition, source/drain regions 121 made of a p-type doped layer are formed at both sides of the first p-type gate electrode 117 in the first n-well 102 and at both sides of the second p-type gate electrode 119 in the second n-well 104.

FIGS. 9A through 9D, FIGS. 10A through 10C and FIGS. 11A and 11B are cross-sectional views illustrating respective process steps of a conventional method for fabricating a semiconductor device (a CMOS transistor) using plasma nitridation so as to introduce nitrogen into gate insulating films.

First, as shown in FIG. 9A, a semiconductor substrate 200 in which a first p-well 201, a first n-well 202, a second p-well 203 and a second n-well 204 are formed is subjected to thermal oxidation, thereby forming a first insulating film 206 on the wells 201 through 204. At this time, isolations 205 are provided between the wells 201 through 204 in the semiconductor substrate 200.

Next, as shown in FIG. 9B, a first photoresist film 207 is formed on a portion of the first insulating film 206 located on the first p-well 201 and the first n-well 202. Then, wet etching is performed using the first photoresist film 207 as a mask, thereby selectively removing a portion of the first insulating film 206 located on the second p-well 203 and the second n-well 204. In other words, the first insulating film 206 remains on the first p-well 201 and the first n-well 202.

Then, as shown in FIG. 9C, the semiconductor substrate 200 is subjected to thermal oxidation, thereby forming a second insulating film 208 out of the first insulating film 206 on the first p-well 201 and the first n-well 202 and also forming a third insulating film 209 with a thickness smaller than that of the second insulating film 208 on the second p-well 203 and the second n-well 204.

Thereafter, as shown in FIG. 9D, the entire surfaces of the second insulating film 208 formed on the first p-well 201 and the first n-well 202 and the third insulating film 209 formed on the second p-well 203 and the second n-well 204 are exposed to nitrogen plasma. Accordingly, a first gate insulating film 211 is formed on the first p-well 201 and the first n-well 202 and a second gate insulating film 212 having a thickness smaller than that of the first gate insulating film 211 is also formed on the second p-well 203 and the second n-well 204. Each of the first gate insulating film 211 and the second gate insulating film 212 includes a nitridation region 210 having a nitrogen concentration peak at the surface of the first or second gate insulating film 211 or 212.

Subsequently, as shown in FIG. 10A, a silicon film 213 is deposited over the semiconductor substrate 200 on which the first gate insulating film 211 and the second gate insulating film 212 are formed. Thereafter, as shown in FIG. 10B, a second photoresist film 214 is formed to cover portions of the silicon film 213 respectively located above the first n-well 202 and the second n-well 204. Subsequently, ions of an n-type dopant are selectively implanted in portions of the silicon film 213 located above the first p-well 201 and the second p-well 203 by using the second photoresist film 214 as a mask, thereby forming an n-type silicon film 215.

Thereafter, as shown in FIG. 10C, a third photoresist film 216 is formed to cover portions of the silicon film 213 respectively located above the first p-well 201 and the second p-well 203. Then, ions of a p-type dopant are selectively implanted in portions of the silicon film 213 respectively located above the first n-well 202 and the second n-well 204 by using the third photoresist film 216 as a mask, thereby forming a p-type silicon film 217.

Subsequently, as shown in FIG. 11A, the n-type silicon film 215 and the p-type silicon film 217 are patterned into gate electrode shapes, thereby forming n-type conductor parts (i.e., a first n-type gate electrode 218 and a second n-type gate electrode 220) out of the n-type silicon film above the first p-well 201 and the second p-well 203, respectively, and also forming p-type conductor parts (i.e., a first p-type gate electrode 219 and a second p-type gate electrode 221) out of the p-type silicon film above the first n-well 202 and the second n-well 204, respectively. The first gate insulating film 211 is interposed between each of the first n-type gate electrode 218 and the first p-type gate electrode 219 and the semiconductor substrate 200. The second gate insulating film 212 is interposed between each of the second n-type gate electrode 220 and the second p-type gate electrode 221 and the semiconductor substrate 200.

Thereafter, as shown in FIG. 11B, source/drain regions 222 made of an n-type doped layer are formed at both sides of the first n-type gate electrode 218 in the first p-well 201 and at both sides of the second n-type gate electrode 220 in the second p-well 203. In addition, source/drain regions 223 made of a p-type doped layer are formed at both sides of the first p-type gate electrode 219 in the first n-well 202 and at both sides of the second p-type gate electrode 221 in the second n-well 204.

SUMMARY OF THE INVENTION

Hereinafter, results of examination made by the inventor of the present invention will be described with respect to properties of gate insulating films of transistors in a CMOS transistor formed by the conventional method for fabricating a semiconductor device (a CMOS transistor) using thermal oxynitridation for nitrogen introduction into the gate insulating films.

FIGS. 12A through 12D are graphs showing nitrogen profiles in thick gate insulating films (i.e., the first gate insulating films 109 between respective ones of the first n-type gate electrode 116 and the first p-type gate electrode 117 and the semiconductor substrate 100 shown in FIG. 8D) of a high-breakdown-voltage nMOS transistor and a high-breakdown-voltage pMOS transistor, respectively, for input/output signals and nitrogen profiles in thin gate insulating films (i.e., the second gate insulating films 110 between respective ones of the second n-type gate electrode 118 and the second p-type gate electrode 119 and the semiconductor substrate 100 shown in FIG. 8D) of a high-speed nMOS transistor and a high-speed pMOS transistor, respectively, in a CMOS transistor fabricated by the conventional method for fabricating a semiconductor device (a CMOS transistor) using thermal oxynitridation for nitrogen introduction into the gate insulating films.

In FIGS. 12A through 12D, the abscissa represents a position in the MOS structure in the height direction, and the ordinate represents a nitrogen concentration in a logarithmic scale.

As shown in FIG. 12A, in the thick gate insulating film (i.e., the first gate insulating film 109 provided between the first n-type gate electrode 116 and the semiconductor substrate 100) of the high-breakdown-voltage nMOS transistor, a large number of states in which fixed charge or holes are easily trapped by nitrogen (in the nitridation region 108) that is present at the interface between the semiconductor substrate 100 and the gate insulating film are formed, so that reliability with respect to hot carriers is enhanced. It is generally known that reliability with respect to hot carriers more greatly deteriorates in a high-breakdown-voltage transistor having a thick gate insulating film and used for input/output signals or in an nMOS transistor than in a high-speed transistor having a thin gate insulating film or in a pMOS transistor.

On the other hand, as shown in FIG. 12B, in the thick gate insulating film (i.e., the first gate insulating film 109 provided between the first p-type gate electrode 117 and the semiconductor substrate 100) of the high-breakdown-voltage pMOS transistor, a large amount of fixed charge is generated by nitrogen (the nitridation region 108) that is present at the interface between the semiconductor substrate 100 and the gate insulating film, resulting in deterioration of reliability with respect to negative bias temperature instability (NBTI).

As shown in FIG. 12C, in the thin gate insulating film (i.e., the second gate insulating film 110 provided between the second n-type gate electrode 118 and the semiconductor substrate 100) of the high-speed nMOS transistor, nitrogen (the nitridation region 108) is present at the interface between the semiconductor substrate 100 and the gate insulating film, so that leakage current is suppressed as compared to a $SiO_2$ film.

As shown in FIG. 12D, in the thin gate insulating film (i.e., the second gate insulating film 110 provided between the second p-type gate electrode 119 and the semiconductor substrate 100) of the high-speed pMOS transistor, nitrogen (the nitridation region 108) is present at the interface between the semiconductor substrate 100 and the gate insulating film, so that leakage current is suppressed and resistance to boron (B) permeation from the gate electrode is enhanced, as compared to a $SiO_2$ film. However, as in the thick gate insulating film of the high-breakdown-voltage pMOS transistor (see FIG. 12B), a large amount of fixed charge is generated by nitrogen that is present at the interface between the semiconductor substrate 100 and the gate insulating film, resulting in deterioration of reliability with respect to NBTI.

Now, results of examination by the inventor of the present invention will be described with respect to properties of gate insulating films of transistors in a CMOS transistor formed by the conventional method for fabricating a semiconductor device (a CMOS transistor) using plasma nitridation for nitrogen introduction into the gate insulating films.

FIGS. 13A through 13D are graphs showing nitrogen profiles in thick gate insulating films (i.e., the first gate insulating films 211 between respective ones of the first n-type gate electrode 218 and the first p-type gate electrode 219 and the semiconductor substrate 200 shown in FIG. 11B) of a high-breakdown-voltage nMOS transistor and a high-breakdown-voltage pMOS transistor, respectively, for input/output signals and nitrogen profiles in thin gate insulating films (i.e., the second gate insulating films 212 between respective ones of the second n-type gate electrode 220 and the second p-type gate electrode 221 and the semiconductor substrate 200 shown in FIG. 11B) of a high-speed nMOS transistor and a high-speed pMOS transistor, respectively, in a CMOS transistor fabricated by the conventional method for fabricating a semiconductor device (a CMOS transistor) using plasma nitridation for nitrogen introduction into the gate insulating films.

In FIGS. 13A through 13D, the abscissa represents a position in the MOS structure in the height direction, and the ordinate represents a nitrogen concentration in a logarithmic scale.

As shown in FIG. 13A, in the thick gate insulating film (i.e., the first gate insulating film 211 provided between the first n-type gate electrode 218 and the semiconductor substrate 200) of the high-breakdown-voltage nMOS transistor, nitrogen (the nitridation region 210) is present near the gate electrode. In other words, no nitrogen is present at the interface between the gate insulating film and the semiconductor substrate 200. Accordingly, a state in which fixed charge or holes are easily trapped by nitrogen that is present at the interface between the gate insulating film and the semiconductor substrate 200 is not formed, so that reliability with respect to hot carriers deteriorates.

On the other hand, as shown in FIG. 13B, in the thick gate insulating film (i.e., the first gate insulating film 211 provided between the first p-type gate electrode 219 and the semiconductor substrate 200) of the high-breakdown-voltage pMOS transistor, nitrogen (the nitridation region 210) is present near the gate electrode. In other words, no nitrogen is present at the interface between the gate insulating film and the semiconductor substrate 200. Accordingly, the amount of fixed charge is reduced, so that reliability with respect to NBTI is enhanced.

As shown in FIG. 13C, in the thin gate insulating film (i.e., the second gate insulating film 212 provided between the second n-type gate electrode 220 and the semiconductor substrate 200) of the high-speed nMOS transistor, nitrogen (the nitridation region 210) is present near the gate electrode. Accordingly, leakage current is suppressed as compared to a $SiO_2$ film.

As shown in FIG. 13D, in the thin gate insulating film (i.e., the second gate insulating film 212 provided between the second p-type gate electrode 221 and the semiconductor substrate 200) of the high-speed pMOS transistor, nitrogen (the nitridation region 210) is present near the gate electrode. Accordingly, leakage current is suppressed and resistance to boron (B) permeation from the gate electrode is enhanced, as compared to a $SiO_2$ film. As in the thick gate insulating film of the high-breakdown-voltage pMOS transistor (see FIG. 13B), no nitrogen is present at the interface between the gate insulating film and the semiconductor substrate 200, so that the amount of fixed charge is reduced, thus enhancing reliability with respect to NBTI.

As described above, the conventional method using thermal oxynitridation for nitrogen introduction into gate insulating films has a drawback in which reliabilities of the high-breakdown-voltage pMOS transistor and the high-speed pMOS transistor with respect to NBTI deteriorate. The conventional method using plasma nitridation for nitrogen introduction into gate insulating films has a drawback in which reliability of the high-breakdown-voltage nMOS transistor with respect to hot carriers deteriorates. That is, in the conventional semiconductor device fabricated by thermal oxynitridation or plasma nitridation, the reliability of a high-breakdown-voltage nMOS transistor with respect to hot carriers and the reliabilities of a high-breakdown-voltage pMOS transistor and a high-speed pMOS transistor with respect to NBTI have a trade-off relationship, and both of these reliabilities cannot be obtained at the same time.

It is therefore an object of the present invention to obtain both reliability with respect to hot carriers and reliability with respect to NBTI in a semiconductor device provided with MOS transistors using multiple power supplies such as a CMOS transistor.

To achieve the object, a semiconductor device according to the present invention includes: a first gate insulating film formed on a first nMOS transistor region in a semiconductor substrate and containing nitrogen; a second gate insulating film formed on a first pMOS transistor region in the semiconductor substrate and containing nitrogen; a third gate insulating film formed on a second nMOS transistor region in the semiconductor substrate and containing nitrogen; and a fourth gate insulating film formed on a second pMOS transistor region in the semiconductor substrate and containing nitrogen, wherein each of the third gate insulating film and the fourth gate insulating film has a thickness smaller than that of each of the first gate insulating film and the second gate insulating film, the first gate insulating film has a nitrogen concentration peak at the interface between the first gate insulating film and the semiconductor substrate, and each of the second, third and fourth gate insulating films has a nitrogen concentration peak only near an associated one of gate electrodes formed on the second, third and fourth gate insulating films, respectively.

That is, as a feature of the present invention, the first gate insulating film (a thick gate insulating film) of a first nMOS transistor (a high-breakdown-voltage nMOS transistor) has a nitrogen concentration peak at the interface between the first gate insulating film and the semiconductor substrate, and each of the second gate insulating film (a thick gate insulating film) of a first pMOS transistor (a high-breakdown-voltage pMOS transistor), a third gate insulating film (a thin gate insulating film) of a second nMOS transistor (a high-speed nMOS transistor) and a fourth gate insulating film (a thin gate insulating film) of a second pMOS transistor (a high-speed pMOS transistor) has a nitrogen concentration peak only near an associated one of gate electrodes.

The semiconductor substrate herein includes a structure in which a semiconductor layer is provided on an insulating substrate (e.g., an SOI substrate).

In the semiconductor device, the first gate insulating film may have another nitrogen concentration peak near the gate electrode formed thereon.

In the semiconductor device, the nitrogen concentration peak of the first gate insulating film at the interface between the first gate insulating film and the semiconductor substrate is preferably 4 atm % or more.

When the nitrogen concentration peak of the first gate insulating film at the substrate interface is too high, specifically when the nitrogen concentration peak exceeds 10 atm %, driving ability of a transistor declines. Therefore, this nitrogen concentration peak is preferably 10 atm % or less.

In the semiconductor device, the nitrogen concentration peak of each of the second, third and fourth gate insulating films near an associated one of the gate electrodes is preferably 8 atm % or more.

The nitrogen concentration peaks of the second through fourth gate insulating films near the respectively associated gate electrodes are preferably as high as possible. However, with the ability of currently-used nitridation techniques (e.g., plasma nitridation), the nitrogen concentration peak is approximately 20 atm % at the maximum.

In the semiconductor device, the nitrogen concentration peak of each of the second, third and fourth gate insulating films near an associated one of the gate electrodes is preferably located at a depth of 1 nm or less from the interface between each of the second, third and fourth gate insulating films and an associated one of the gate electrodes.

In the semiconductor device, each of the second and fourth gate insulating films preferably has a nitrogen concentration of 3 atm % or less at the interface between each of the second and fourth gate insulating films and the semiconductor substrate.

Preferably, in the semiconductor device, each of the gate electrodes formed on the respective first and third gate insulating films includes an n-type polycrystalline silicon film, and each of the gate electrodes formed on the respective second and fourth gate insulating films includes a p-type polycrystalline silicon film.

A method for fabricating a semiconductor device according to the present invention includes the steps of: (a) oxidizing a semiconductor substrate in which a first p-type semiconductor region, a first n-type semiconductor region, a second p-type semiconductor region and a second n-type semiconductor region are formed, thereby forming a first insulating film on the semiconductor regions; (b) performing thermal oxynitridation on the first insulating film in an atmosphere containing nitrogen, thereby forming, on the semiconductor regions, a second insulating film having a nitrogen concentration peak at the interface between the semiconductor substrate and the second insulating film; (c) selectively removing portions of the second insulating film located on the first n-type semiconductor region, the second p-type semiconductor region and the second n-type semiconductor region, respectively, thereby leaving the second insulating film only on the first p-type semiconductor region; (d) oxidizing the semiconductor substrate with increase of thickness of the second insulating film on the first p-type semiconductor region suppressed, thereby forming a third insulating film on the first n-type semiconductor region, the second p-type semiconductor region and the second n-type semiconductor region; (e) selectively removing portions of the third insulating film located on the second p-type semiconductor region and the second n-type semiconductor region, respectively, thereby leaving the third insulating film only on the first n-type semiconductor region and also leaving the second insulating film on the first p-type semiconductor region; (f) oxidizing the semiconductor substrate with increase of thickness of the second insulating film on the first p-type semiconductor region and increase of thickness of the third insulating film on the first n-type semiconductor region suppressed, thereby forming a fourth insulating film on the second p-type semiconductor region and the second n-type semiconductor region such that the fourth insulating film has a thickness smaller than that of each of the second and third insulating films; and (g) exposing the second insulating film on the first p-type semiconductor region, the third insulating film on the first n-type semiconductor region, and the fourth insulating film on the second p-type semiconductor region and the second n-type semiconductor region to nitrogen plasma, thereby forming, on the first p-type semiconductor region, a fifth insulating film that is to be a gate insulating film (a first gate insulating film) of a first nMOS transistor and has nitrogen concentration peaks in a surface portion thereof and at the interface between the fifth insulating film and the semiconductor substrate, respectively, forming, on the first n-type semiconductor region, a sixth insulating film that is to be a gate insulating film (a second gate insulating film) of a first pMOS transistor and has a nitrogen concentration peak only in a surface portion thereof, and forming, on the second p-type semiconductor region and the second n-type semiconductor region, a seventh insulating film that is to be a gate insulating film (a third gate insulating film) of a second nMOS transistor and a gate insulating film (a fourth gate insulating film) of a second pMOS transistor and has nitrogen concentration peaks only in a surface portion thereof, wherein the seventh insulating film has a thickness smaller than that of each of the fifth and sixth insulating films. That is, the method for fabricating a semiconductor device according to the present invention is a method for fabricating the semiconductor device of the present invention.

In the method, in the step (d), the semiconductor substrate is preferably oxidized such that the second insulating film and the third insulating film have an identical thickness.

The method may further include, after the step (g), the steps of: (h) depositing a silicon film over the semiconductor substrate; (i) selectively introducing an n-type dopant in portions of the silicon film located above the first p-type semiconductor region and the second p-type semiconductor region, respectively, thereby forming an n-type silicon film above the first p-type semiconductor region and the second p-type semiconductor region, respectively; (j) selectively introducing a p-type dopant in portions of the silicon film located above the first n-type semiconductor region and the second n-type semiconductor region, respectively, thereby forming a p-type silicon film above the first n-type semiconductor region and the second n-type semiconductor region; (k) patterning the n-type silicon film and the p-type silicon film such that a first n-type gate electrode is formed above the first p-type semiconductor region with the fifth insulating film interposed therebetween, a first p-type gate electrode is formed above the first n-type semiconductor region with the sixth insulating film interposed therebetween, and a second n-type gate electrode and a second p-type gate electrode are formed above the second p-type semiconductor region and the second n-type semiconductor region, respectively, with the seventh insulating films interposed between the second n-type gate electrode and the second p-type semiconductor region and between the second p-type gate electrode and the second n-type semiconductor region; and (l) forming an n-type doped layer to be source/drain regions at both sides of the first n-type gate electrode in the first p-type semiconductor region and at both sides of the second n-type gate electrode in the second p-type semiconductor region and forming a p-type doped layer to be source/drain regions at both sides of the first p-type gate electrode in the first n-type semiconductor region and at both sides of the second p-type gate electrode in the second n-type semiconductor region, thereby forming a first nMOS transistor in the first p-type semiconductor region, a first pMOS transistor in the first n-type semiconductor region, a second nMOS transistor in the second p-type semiconductor region, and a second pMOS transistor in the second n-type semiconductor region. Any of the steps (i) and (j) may be performed prior to the other.

In the method, in the step (b), the thermal oxynitridation is preferably performed on the first insulating film in an atmosphere containing at least one of nitrogen monoxide and dinitrogen monoxide with a single-wafer lamp heating apparatus.

Preferably, in the method, in at least one of the steps (d) and (f), with a single-wafer lamp heating apparatus, the pressure in a chamber of the apparatus is kept at 2667 Pa or less and a hydrogen gas and an oxygen gas are introduced into the chamber such that the hydrogen gas and the oxygen gas are caused to react with each other by heat from the surface of the semiconductor substrate heated with the apparatus and the semiconductor substrate is oxidized by oxygen radicals generated by the reaction.

According to the present invention, the following advantages are obtained. That is, in a first gate insulating film (a thick gate insulating film) of a first nMOS transistor (a high-breakdown-voltage nMOS transistor), a large number of states in which fixed charge or holes are easily trapped by nitrogen that is present at the interface between the first gate insulating film and the semiconductor substrate are formed, so that reliability with respect to hot carriers is enhanced. In a second gate insulating film (a thick gate insulating film) of a first pMOS transistor (a high-breakdown-voltage pMOS transistor), nitrogen is present only near the gate electrode. In other words, no nitrogen is present at the interface between the second gate insulating film and the semiconductor substrate. Accordingly, the amount of fixed charge is reduced, thus enhancing reliability with respect to NBTI. In a third gate insulating film (a thin gate insulating film) of a second nMOS transistor (a high-speed nMOS transistor), nitrogen is present near the gate electrode, so that leakage current is suppressed as compared to a $SiO_2$ film. In a fourth gate insulating film (a thin gate insulating film) of a second pMOS transistor (a high-speed pMOS transistor), nitrogen is present near the gate electrode. Accordingly, leakage current is suppressed and resistance to B permeation from the gate electrode is enhanced, as compared to a $SiO_2$ film. In addition, as in the second gate insulating film (the thick gate insulating film) of the first pMOS transistor (the high-breakdown-voltage pMOS transistor), no nitrogen is present at the interface between the fourth gate insulating film and the semiconductor substrate, the amount of fixed change is reduced. Accordingly, reliability with respect to NBTI is enhanced.

As described above, the present invention relates to a semiconductor device and a method for fabricating the device. In particular, in application of the present invention to a semiconductor device including MOS transistors using multiple power supplies such as a CMOS transistor, both reliability of a high-breakdown-voltage nMOS transistor with respect to hot carriers and reliabilities of a high-breakdown-voltage pMOS transistor and a high-speed pMOS transistor with respect to NBTI are enhanced. In addition, in a thin gate insulating film of a high-speed MOS transistor, leakage current is suppressed and resistance to B permeation is enhanced. Accordingly, the present invention is very useful.

DESCRIPTION OF THE PREFERRED EMBODIMENTS

Embodiment

Hereinafter, a semiconductor device and a method for fabricating the device according to an embodiment of the present invention will be described with reference to the drawings, using a CMOS transistor as an example.

FIGS. 1A through 1D, FIGS. 2A through 2D and FIGS. 3A through 3D are cross-sectional views illustrating respective process steps of a method for fabricating a semiconductor device according to this embodiment.

Figure 1A:
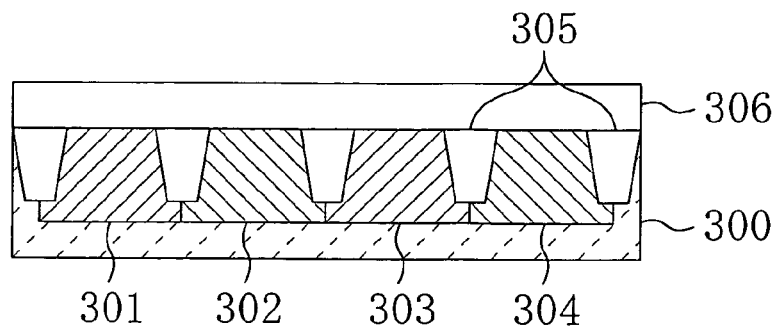
FIGS. 1A through 1D are cross-sectional views illustrating respective process steps of a method for fabricating a semiconductor device according to an embodiment of the present invention.

First, as shown in FIG. 1A, a semiconductor substrate 300 in which a first p-well 301, a first n-well 302, a second p-well 303 and a second n-well 304 are formed is oxidized using oxygen radicals (O.) with lamp heating apparatus of a single-wafer processing type (hereinafter, referred to as single-wafer lamp heating apparatus), for example, thereby forming a first insulating film (a SiO$_2$ film) 306 with a thickness of 4.5 nm, for example, on the wells 301 through 304. As specific conditions of heat treatment in this case, the temperature is 1050° C., a hydrogen (H$_2$) gas (at a flow rate of 0.5 l/min (standard condition)) and an oxygen (O$_2$) gas (at a flow rate of 9.5 l/min (standard condition)) are used, the pressure is 933 Pa and the time is 15 seconds. Isolations 305 are provided between the wells 301 through 304 in the semiconductor substrate 300.

Figure 1B:
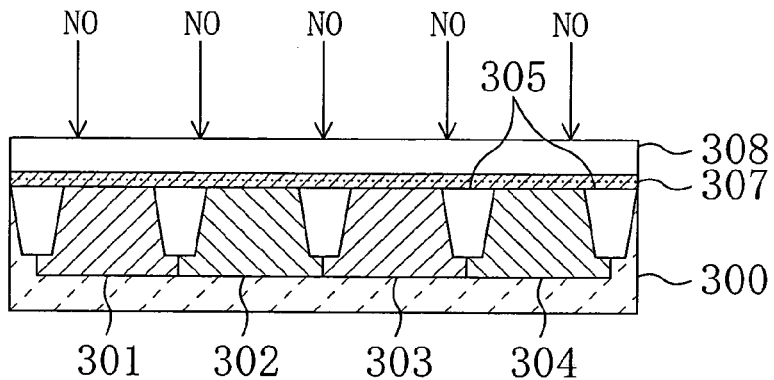

Next, the first insulating film 306 is subjected to thermal oxynitridation with single-wafer lamp heating apparatus, for example, thereby forming a second insulating film (a SiON film) 308 including a first nitridation region 307 having a nitrogen concentration peak at the interface between the second insulating film 308 and the semiconductor substrate 300, as shown in FIG. 1B. As specific conditions of heat treatment in this case, the temperature is 1000° C., a nitrogen monoxide (NO) gas (at a flow rate of 1.0 l/min (standard condition)) is used, the pressure is 9.9×10$^4$ Pa, and the time is 100 seconds.

Figure 1C:
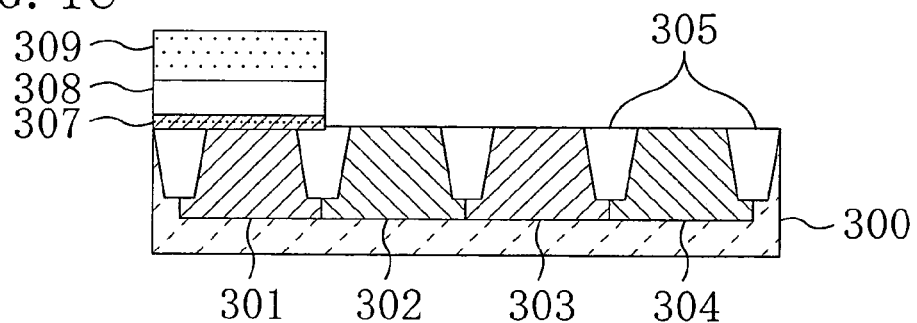

Then, as shown in FIG. 1C, a first photoresist film 309 is formed on a portion of the second insulating film 308 located above the first p-well 301. Subsequently, wet etching with, for example, hydrofluoric acid is performed using the first photoresist film 309 as a mask, thereby selectively removing a portion of the second insulating film 308 (including an associated portion of the first nitridation region 307) located on the first n-well 302, the second p-well 303 and the second n-well 304. In other words, the second insulating film 308 (including the first nitridation region 307) remains on the first p-well 301.

Figure 1D:
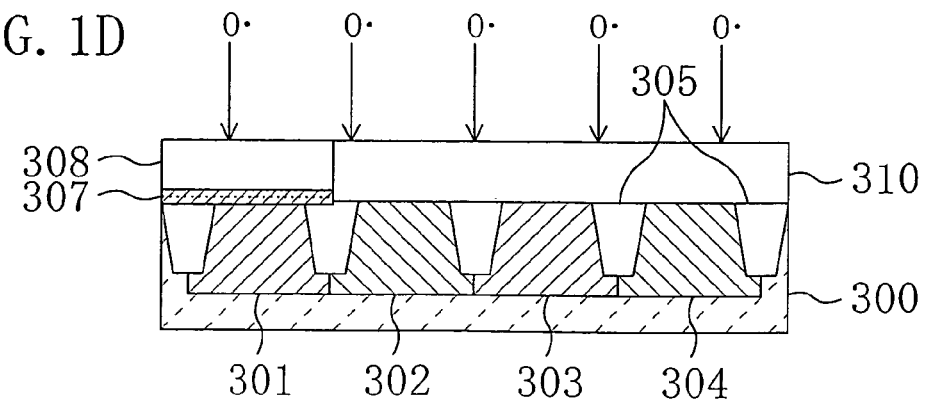

Thereafter, as shown in FIG. 1D, the semiconductor substrate 300 is oxidized using oxygen radicals (O.) with single-wafer lamp heating apparatus, for example, thereby forming a third insulating film (a SiO$_2$ film) 310 with a thickness of, for example, 7.5 nm on the surfaces of the first n-well 302, the second p-well 303 and the second n-well 304. As specific conditions of heat treatment in this case, the temperature is 1050° C., a hydrogen (H$_2$) gas (at a flow rate of 0.1 l/min (standard condition)) and an oxygen (O$_2$) gas (at a flow rate of 9.9 l/min (standard condition)) are used, the pressure is 1333 Pa, and the time is 100 seconds. That is, in the process step shown in FIG. 1D, the hydrogen gas and the oxygen gas are caused to react with each other by heat from the surface of the semiconductor substrate 300 heated with the single-wafer lamp heating apparatus, thereby generating oxygen radicals. At this time, diffusion power of the oxygen radicals in an oxide film is low, so that increases of thickness of the second insulating film 308 formed on the first p-well 301 is suppressed to about 3 nm. On the other hand, in the process step shown in FIG. 1D, oxidation power of oxygen radicals is high, so that nitrogen which has not been removed from the surfaces of the first n-well 302, the second p-well 303 and the second n-well 304 with hydrofluoric acid in the process step shown in FIG. 1C (specifically, nitrogen contained in remaining SiON) is changed into ammonia ($NH_3$) and is completely removed.

Figure 4:
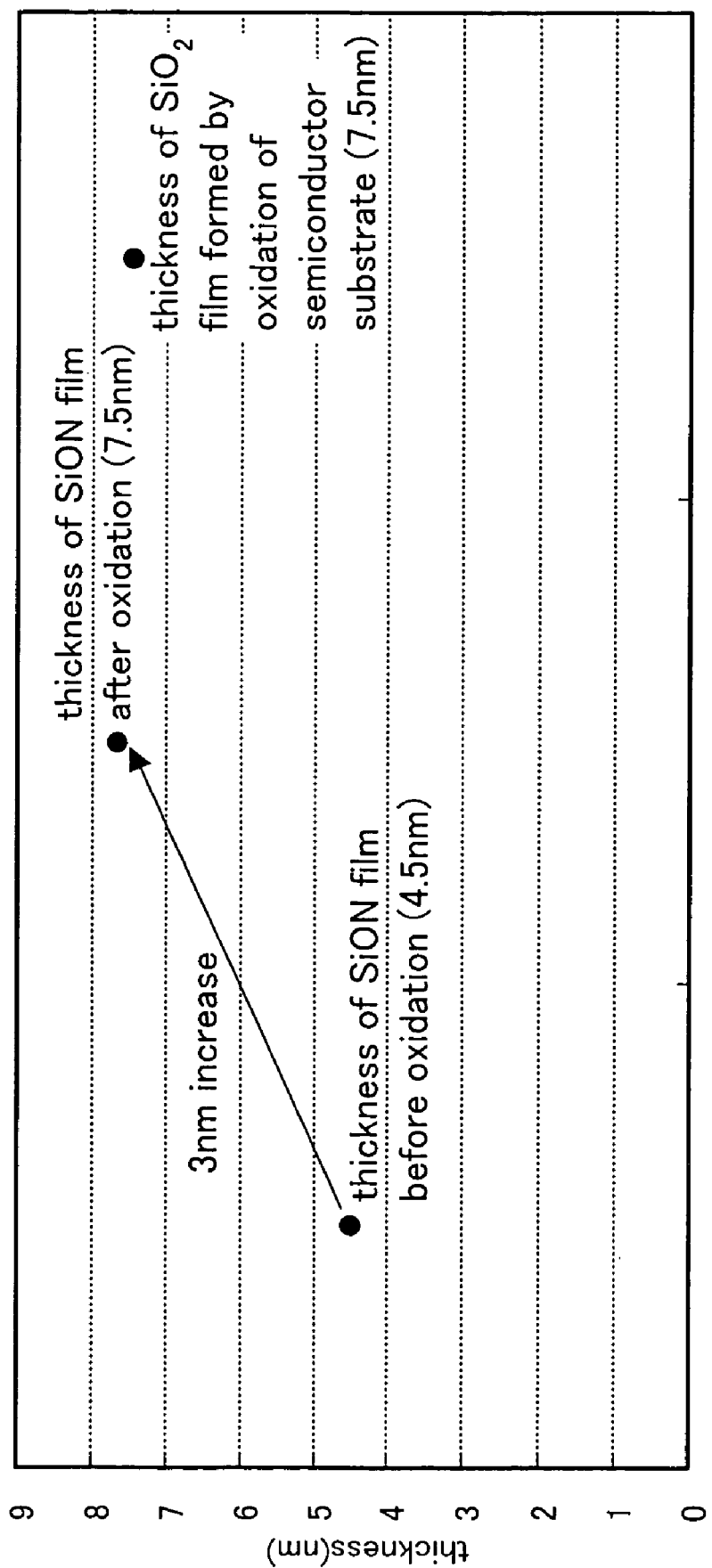
FIG. 4 is a graph for explaining oxidation using oxygen radicals in a process step of the method for fabricating a semiconductor device according to the embodiment of the present invention and shows a variation in thickness of an oxynitride film (a SiON film) with a thickness of 4.5 nm when the film is oxidized using oxygen radicals together with the thickness of a $SiO_2$ film newly formed on a semiconductor substrate through the oxidation.

FIG. 4 shows a variation in thickness of an oxynitride film (a SiON film) with a thickness of 4.5 nm when the film is oxidized using oxygen radicals (O.) and also shows the thickness of a $SiO_2$ film newly formed on the semiconductor substrate through this oxidation. As conditions of heat treatment in this case, as in the process step shown in FIG. 1D, the temperature is 1050° C., a hydrogen ($H_2$) gas (at a flow rate of 0.1 l/min (standard condition)) and an oxygen ($O_2$) gas (at a flow rate of 9.9 l/min (standard condition)) are used, the pressure is 1333 Pa, and the time is 100 seconds. These thicknesses are measured by ellipsometry. As shown in FIG. 4, the oxidation with oxygen radicals (O.) substantially equalize the thickness of the SiON film (corresponding to the second insulating film 308 of this embodiment) after the oxidation and the thickness of the newly-formed $SiO_2$ film (corresponding to the third insulating film 310 of this embodiment).

Figure 2A:
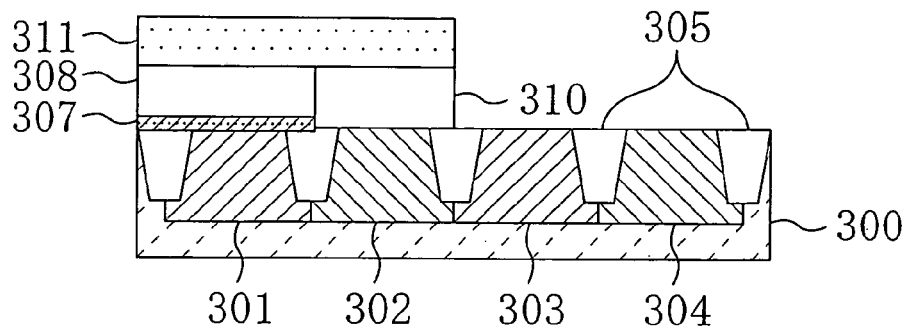
FIGS. 2A through 2D are cross-sectional views illustrating respective process steps of the method for fabricating a semiconductor device according to the embodiment of the present invention.

Then, as shown in FIG. 2A, a second photoresist film 311 is formed on the second insulating film 308 remaining on the first p-well 301 and a portion of the third insulating film 310 located on the first n-well 302. Thereafter, wet etching with, for example, hydrofluoric acid is performed using the second photoresist film 311 as a mask, thereby selectively removing a portion of the third insulating film 310 located on the second p-well 303 and the second n-well 304. In other words, the second insulating film 308 (including the first nitridation region 307) remains on the first p-well 301 and the third insulating film 310 remains on the first n-well 302.

Figure 2B:
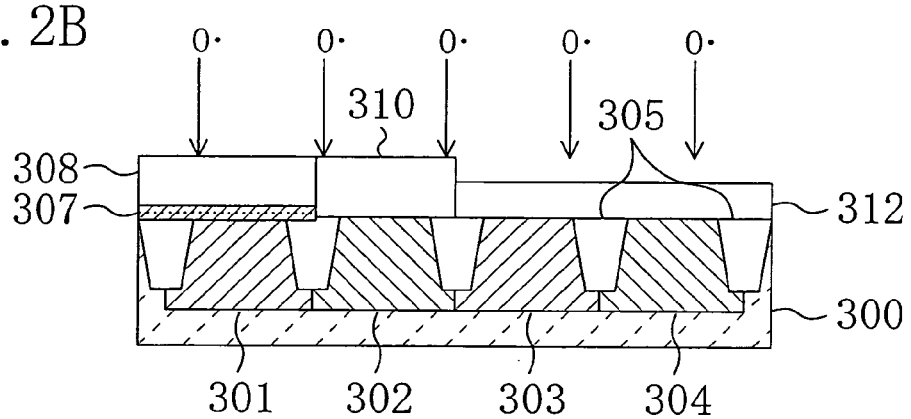

Thereafter, as shown in FIG. 2B, the semiconductor substrate 300 is oxidized using oxygen radicals (O.) with single-wafer lamp heating apparatus, for example, thereby forming, on the surfaces of the second p-well 303 and the second n-well 304, a fourth insulating film (a $SiO_2$ film) 312 with a thickness (e.g., 2.0 nm) smaller than those of the second insulating film 308 and the third insulating film 310. As specific conditions of heat treatment in this case, the temperature is 800° C., a hydrogen ($H_2$) gas (at a flow rate of 0.03 l/min (standard condition)) and an oxygen ($O_2$) gas (at a flow rate of 2.97 l/min (standard condition)) are used, the pressure is $2.4 \times 10^3$ Pa, and the time is 15 seconds. That is, in the process step shown in FIG. 2B, the hydrogen gas and the oxygen gas are caused to react with each other by heat from the surface of the semiconductor substrate 300 heated with the single-wafer lamp heating apparatus, thereby generating oxygen radicals. At this time, diffusion power of the oxygen radicals in an oxide film is low, so that the thickness of the second insulating film 308 on the first p-well 301 hardly increases and the thickness of the third insulating film 310 on the first n-well 302 also hardly increases.

Figure 5:
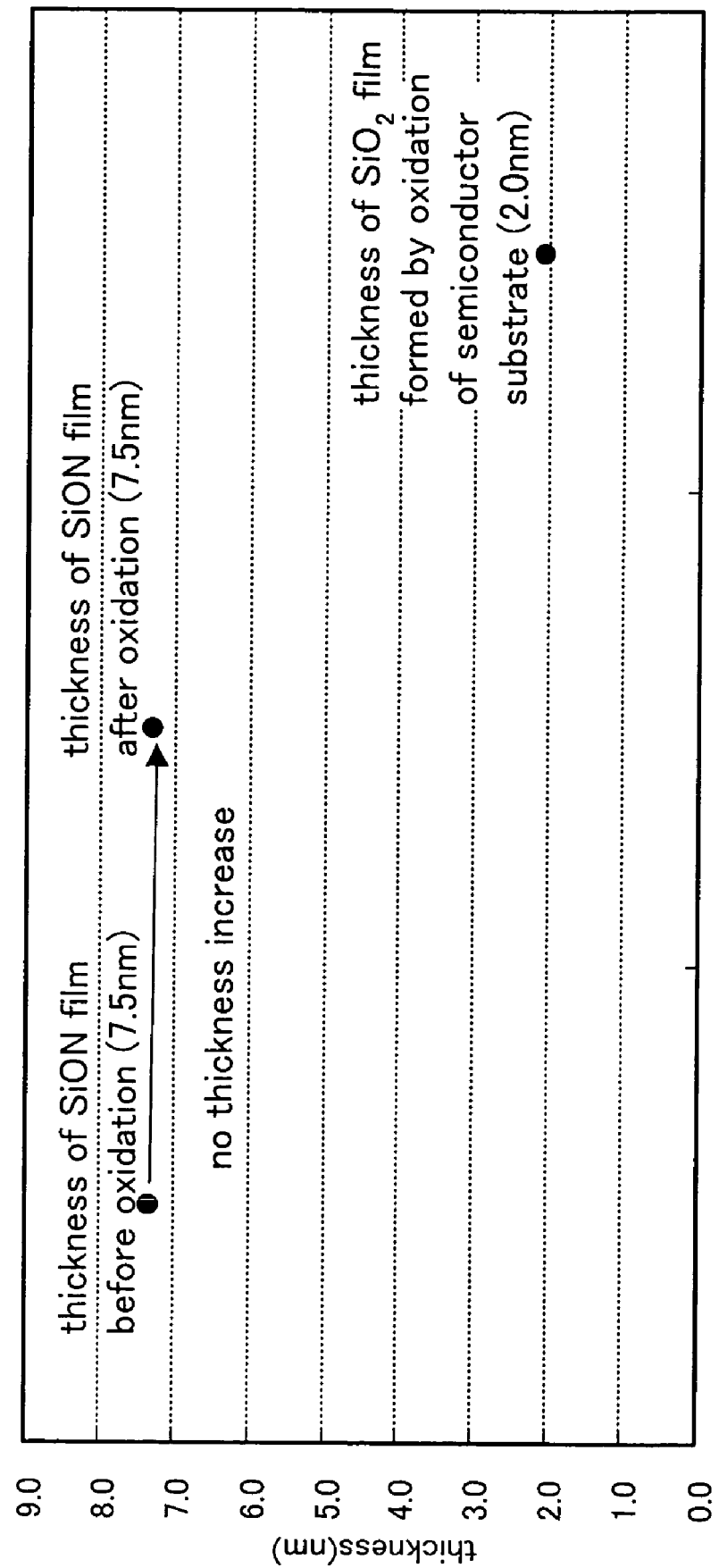
FIG. 5 is a graph for explaining oxidation using oxygen radicals in a process step of the method for fabricating a semiconductor device according to the embodiment of the present invention and shows a variation in thickness of an oxynitride film (a SiON film) with a thickness of 7.5 nm when the film is oxidized using oxygen radicals together with the thickness of a SiO$_2$ film newly formed on a semiconductor substrate through the oxidation.

FIG. 5 shows a variation in thickness of an oxynitride film (a SiON film) with a thickness of 7.5 nm when the film is oxidized using oxygen radicals (O.) and also shows the thickness of a $SiO_2$ film newly formed on the semiconductor substrate through this oxidation. As conditions of heat treatment in this case, the temperature is 850° C., a hydrogen ($H_2$) gas (at a flow rate of 0.05 l/min (standard condition)), an oxygen ($O_2$) gas (at a flow rate of 5.0 l/min (standard condition)) and a nitrogen ($N_2$) gas for dilution (at a flow rate of 4.95 l/min (standard condition)) are used, the pressure is $2.4 \times 10^3$ Pa, and the time is 15 seconds. These thicknesses are measured by ellipsometry. As shown in FIG. 5, the thickness of the SiON film (corresponding to the second insulating film 308 of this embodiment) hardly varies through the oxidation using oxygen radicals (O.).

Figure 2C:
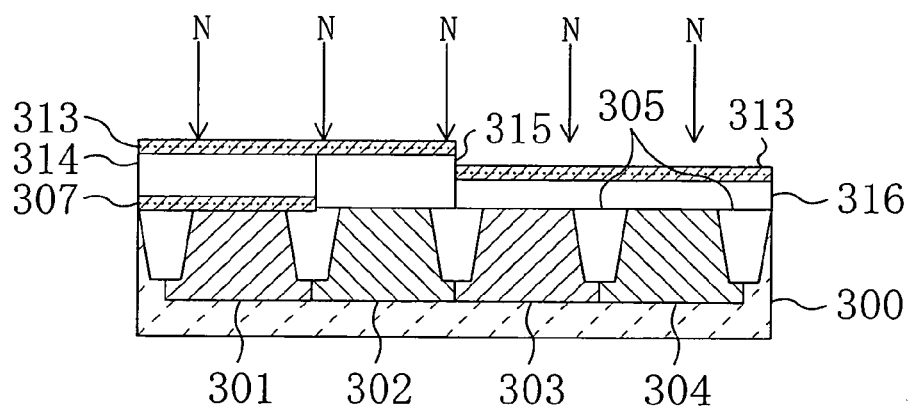

Subsequently, the second insulating film 308 on the first p-well 301, the third insulating film 310 on the first n-well 302 and the fourth insulating film 312 on the second p-well 303 and the second n-well 304 are subjected to plasma nitridation. Accordingly, as shown in FIG. 2C, a fifth insulating film 314 with a thickness of 7.5 nm to be a gate insulating film (a first gate insulating film) of a first nMOS transistor is formed on the first p-well 301. The fifth insulating film 314 includes the first nitridation region 307 having a nitrogen concentration peak at the interface between the fifth insulating film 314 and the semiconductor substrate 300, and also includes a second nitridation region 313 having a nitrogen concentration peak at the surface of the fifth insulating film 314. A sixth insulating film 315 to be a gate insulating film (a second gate insulating film) of a first pMOS transistor is also formed on the first n-well 302. The sixth insulating film 315 includes a second nitridation region 313 having a nitride concentration peak at the surface of the sixth insulating film 315. A seventh insulating film 316 with a thickness of 2.0 nm is formed on the second p-well 303 and the second n-well 304. A portion of the seventh insulating film 316 located on the second p-well 303 is to be a gate insulating film (a third gate insulating film) of a second nMOS transistor and the other portion of the seventh insulating film 316 located on the second n-well 304 is to be a gate insulating film (a fourth gate insulating film) of a second pMOS transistor. The seventh insulating film 316 includes a second nitridation region 313 having a nitrogen concentration peak at the surface of the seventh insulating film 316 and has a thickness smaller than those of the fifth insulating film 314 and the sixth insulating film 315.

As specific conditions of the plasma nitridation in the process step shown in FIG. 2C, the stage temperature is 400° C., the radio frequency (RF) power is 1500 W, an argon (Ar) gas (at a flow rate of 2.0 l/min (standard condition)) and a nitrogen ($N_2$) gas (at a flow rate of 0.14 l/min (standard condition)) are used, the pressure is 126.6 Pa, and the time is 20 seconds.

Figure 2D:
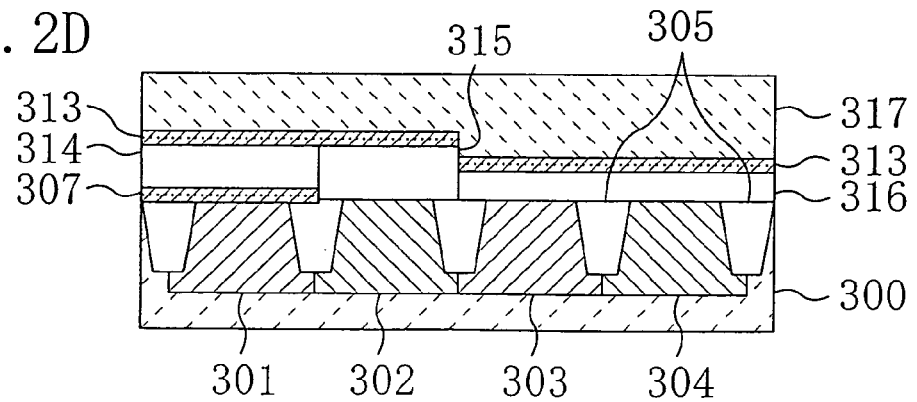
Figure 3A:
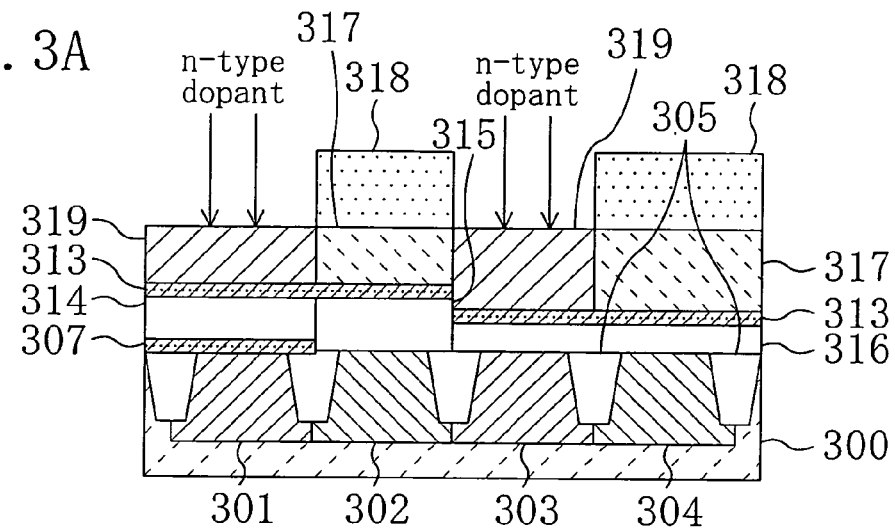
FIGS. 3A through 3D are cross-sectional views illustrating respective process steps of the method for fabricating a semiconductor device according to the embodiment of the present invention.

Then, as shown in FIG. 2D, a silicon film (e.g., a polycrystalline silicon film) 317 is deposited over the semiconductor substrate 300 on which the fifth insulating film 314, the sixth insulating film 315 and the seventh insulating film 316 are formed. Thereafter, as shown in FIG. 3A, third photoresist films 318 are formed to cover portions of the silicon film 317 respectively located on the first n-well 302 and the second n-well 304. Then, ions of an n-type dopant (impurity) are selectively implanted in portions of the silicon film 317 respectively located on the first p-well 301 and the second p-well 303, using the third photoresist films 318 as a mask, thereby forming an n-type silicon film 319.

Figure 3B:
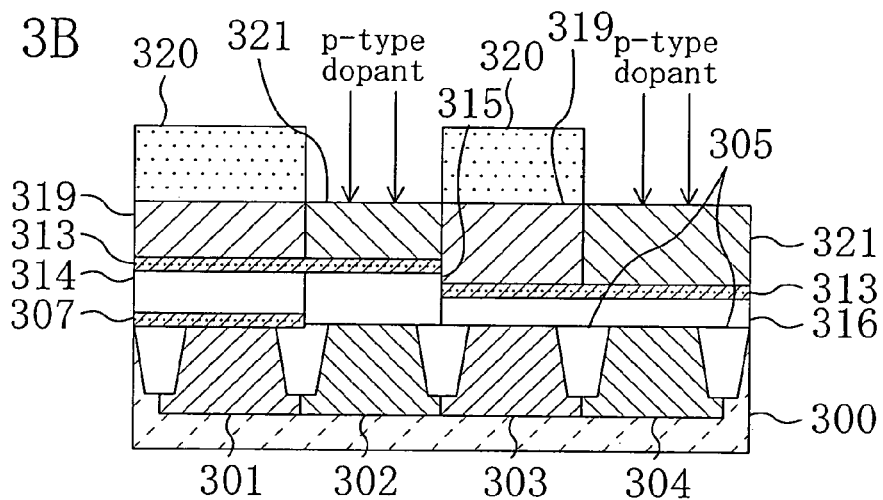

Thereafter, as shown in FIG. 3B, fourth photoresist films 320 are formed to cover the portions of the silicon film 317 (i.e., the n-type silicon film 319) located above the first p-well 301 and the second p-well 303. Thereafter, ions of a p-type dopant are selectively implanted in the portions of the silicon film 317 respectively located above the first n-well 302 and the second n-well 304 using the fourth photoresist films 320 as a mask, thereby forming a p-type silicon film 321.

Figure 3C:
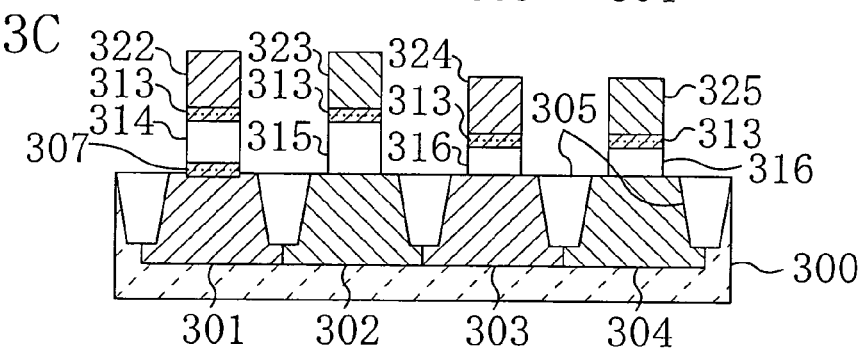

Subsequently, as shown in FIG. 3C, the n-type silicon film 319 and the p-type silicon film 321 are patterned into gate electrode shapes, thereby forming n-type conductor parts (i.e., a first n-type gate electrode 322 and a second n-type gate electrode 324) out of the n-type silicon film above the first p-well 301 and the second p-well 303, respectively, and also forming p-type conductor parts (i.e., a first p-type gate electrode 323 and a second p-type gate electrode 325) out of the p-type silicon film above the first n-well 302 and the second n-well 304, respectively.

Figure 3D:
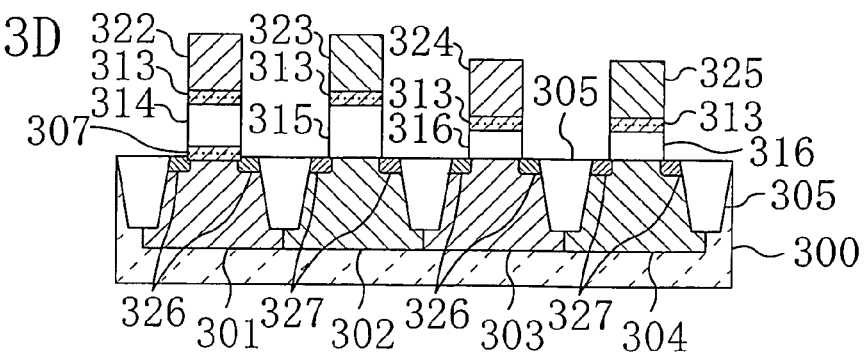

Lastly, as shown in FIG. 3D, source/drain regions 326 made of an n-type doped layer are formed at both sides of the first n-type gate electrode 322 in the first p-well 301 and at both sides of the second n-type gate electrode 324 in the second p-well 303. Source/drain regions 327 made of a p-type doped layer are formed at both sides of the first p-type gate electrode 323 in the first n-well 302 and at both sides of the second p-type gate electrode 325 in the second n-well 304.

Now, advantages of this embodiment will be described with reference to FIGS. 6A through 6D.

FIGS. 6A through 6D are graphs showing a nitrogen profile in a thick gate insulating film (i.e., the fifth insulating film (the first gate insulating film) 314 between the first n-type gate electrode 322 and the semiconductor substrate 300 shown in FIG. 3D) of a high-breakdown-voltage nMOS transistor for input/output signals, a nitrogen profile in a thick gate insulating film (i.e., the sixth insulating film (the second gate insulating film) 315 between the first p-type gate electrode 323 and the semiconductor substrate 300 shown in FIG. 3D) of a high-breakdown-voltage pMOS transistor for input/output signals, and nitrogen profiles in thin gate insulating films (i.e., the seventh insulating films (the third and fourth gate insulating films) 316 between respective ones of the second n-type gate electrode 324 and the second p-type gate electrode 325 and the semiconductor substrate 300) of a high-speed nMOS transistor and a high-speed pMOS transistor, respectively, in the CMOS transistor fabricated by the method for fabricating a semiconductor device (a CMOS transistor) according to this embodiment.

In FIGS. 6A through 6D, the abscissa represents a position in the MOS structure in the height direction and the ordinate represents a nitrogen concentration in a logarithmic scale.

Figure 6A:
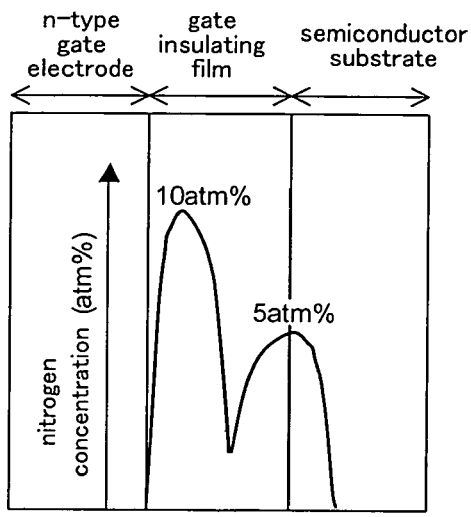
FIGS. 6A through 6D are graphs showing a nitrogen profile in a thick gate insulating film of a high-breakdown-voltage nMOS transistor for input/output signals, a nitrogen profile in a thick gate insulating film of a high-breakdown-voltage pMOS transistor for input/output signals, and nitrogen profiles in thin gate insulating films of a high-speed nMOS transistor and a high-speed pMOS transistor, respectively, in a CMOS transistor fabricated by the method for fabricating a semiconductor device according to the embodiment of the present invention.

As shown in FIG. 6A, in the thick gate insulating film (i.e., the fifth gate insulating film 314 provided between the first n-type gate electrode 322 and the semiconductor substrate 300) of the high-breakdown-voltage nMOS transistor, a large number of states in which fixed charge or holes are easily trapped by nitrogen (in the nitridation region 307) that is present at the interface between the gate insulating film and the semiconductor substrate 300 are formed, so that reliability with respect to hot carriers is enhanced.

Figure 6B:
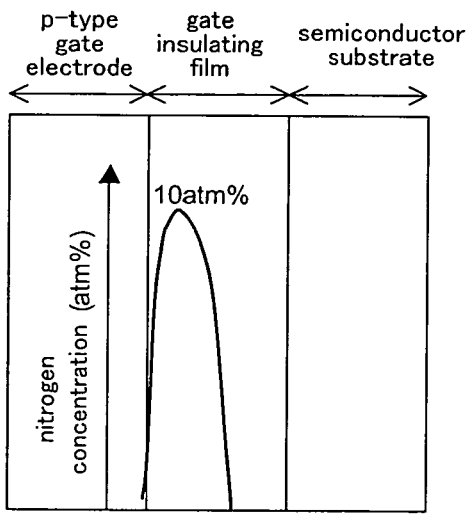

As shown in FIG. 6B, in the thick gate insulating film (i.e., the sixth gate insulating film 315 provided between the first p-type gate electrode 323 and the semiconductor substrate 300) of the high-breakdown-voltage pMOS transistor, nitrogen (the second nitridation region 313) is present only near the first p-type gate electrode 323. In other words, no nitrogen is present at the interface between the gate insulating film and the semiconductor substrate 300. Accordingly, the amount of fixed charge is reduced, so that reliability with respect to NBTI is enhanced.

Figure 6C:
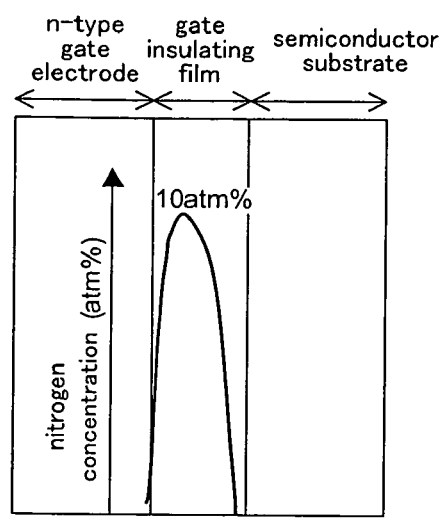

As shown in FIG. 6C, in the thin gate insulating film (i.e., the seventh gate insulating film 316 provided between the second n-type gate electrode 324 and the semiconductor substrate 300) of the high-speed nMOS transistor, nitrogen (the nitridation region 313) is present near the second n-type gate electrode 324, so that leakage current is suppressed as compared to a $SiO_2$ film.

Figure 6D:
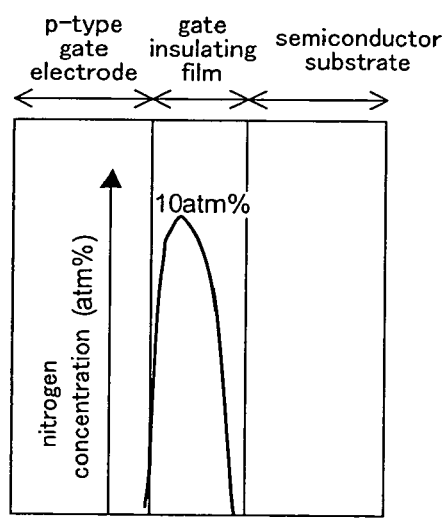
Figure 7A:
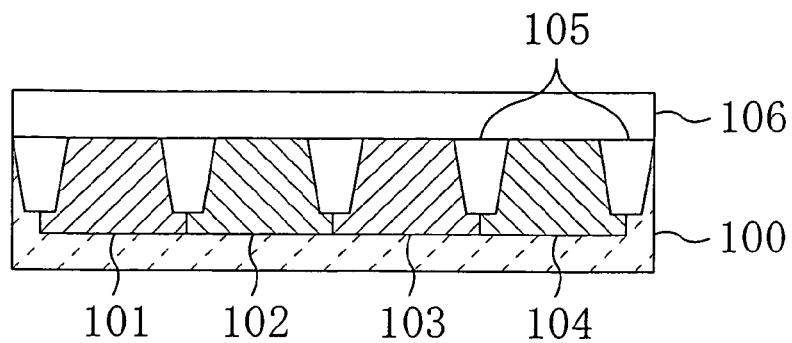
FIGS. 7A through 7D are cross-sectional views illustrating respective process steps of a conventional method for fabricating a semiconductor device (a CMOS transistor) using thermal oxynitridation so as to introduce nitrogen into gate insulating films.
Figure 7B:
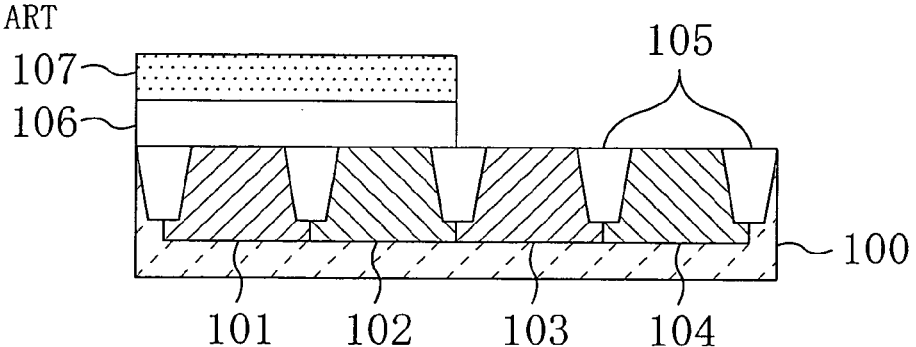
Figure 7C:
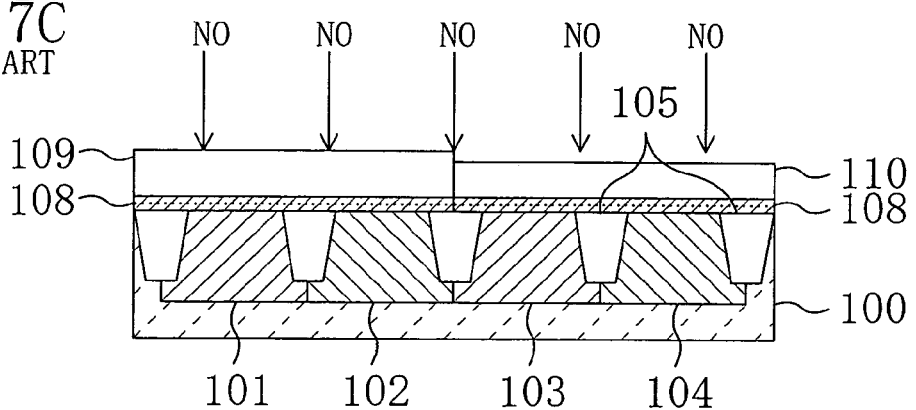
Figure 7D:
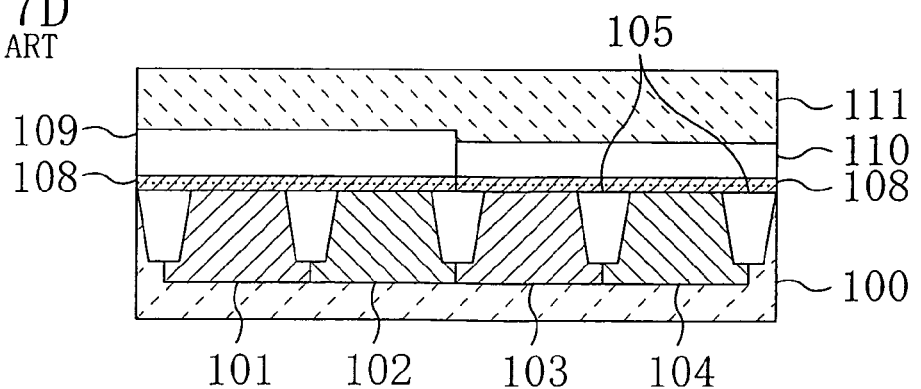
Figure 8A:
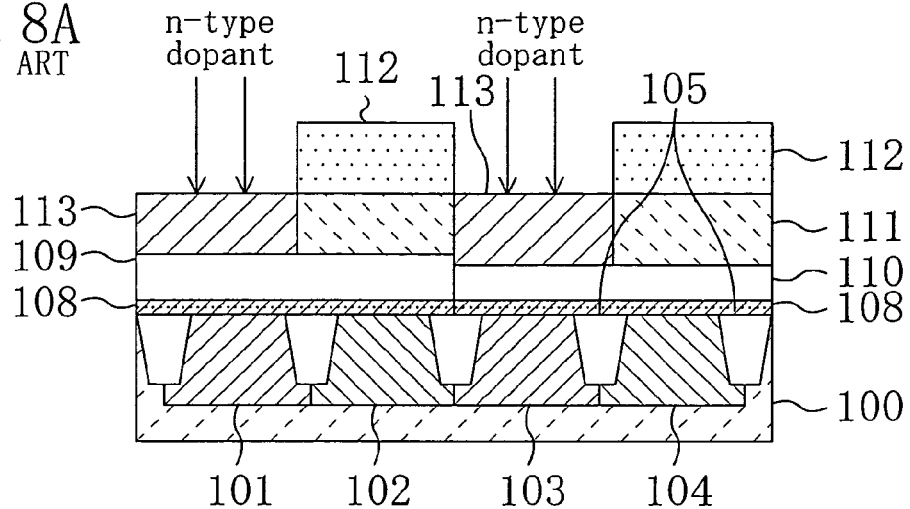
FIGS. 8A through 8D are cross-sectional views illustrating respective process steps of the conventional method for fabricating a semiconductor device (a CMOS transistor) using thermal oxynitridation so as to introduce nitrogen into gate insulating films.
Figure 8B:
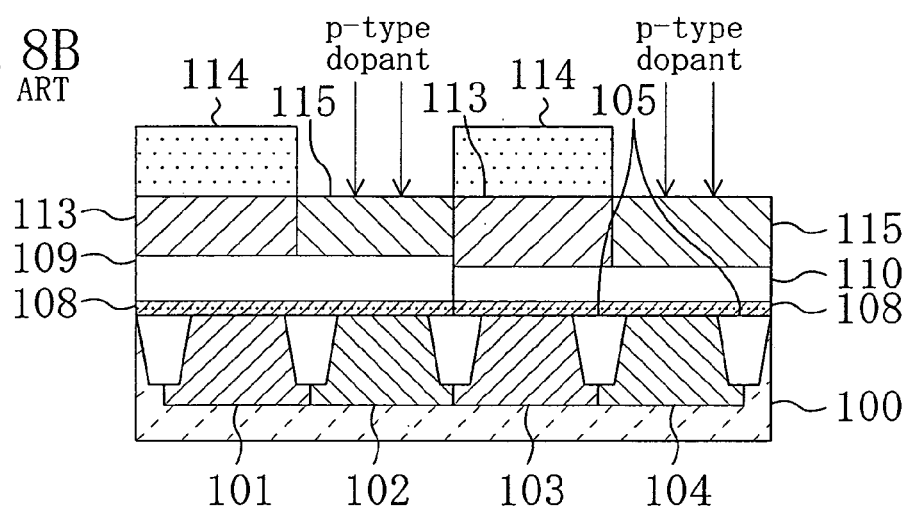
Figure 8C:
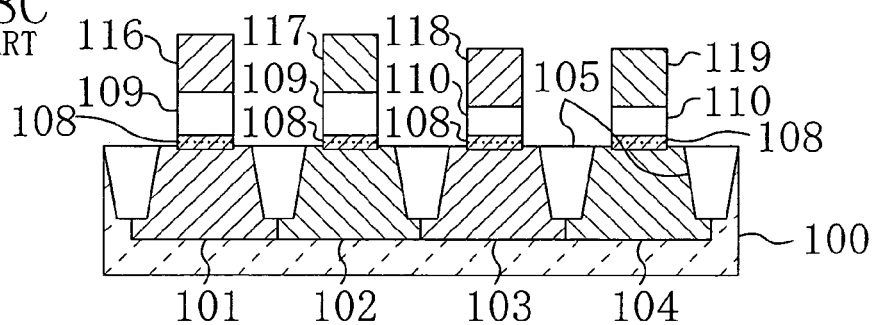
Figure 8D:
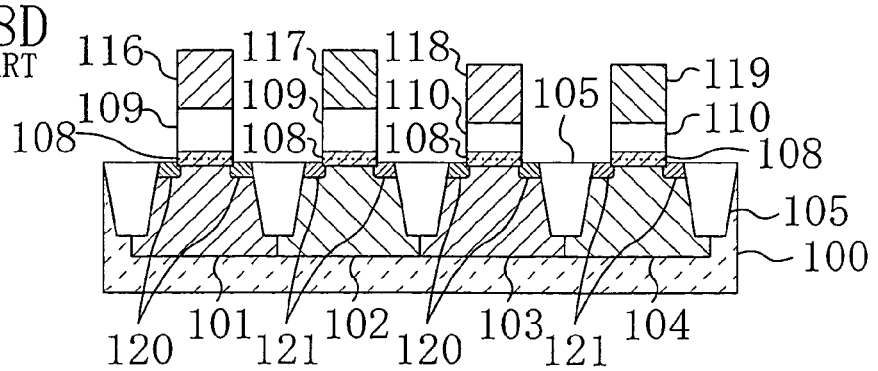
Figure 9A:
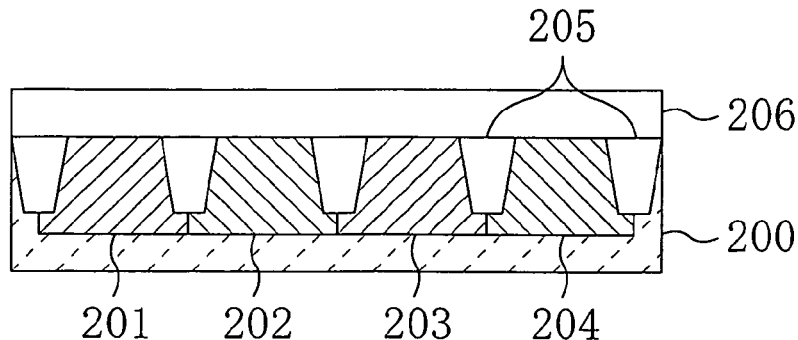
FIGS. 9A through 9D are cross-sectional views illustrating respective process steps of a conventional method for fabricating a semiconductor device (a CMOS transistor) using plasma nitridation so as to introduce nitrogen into gate insulating films.
Figure 9B:
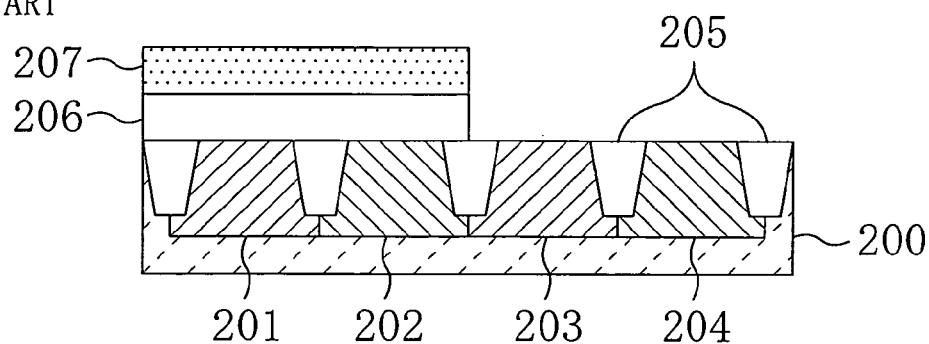
Figure 9C:
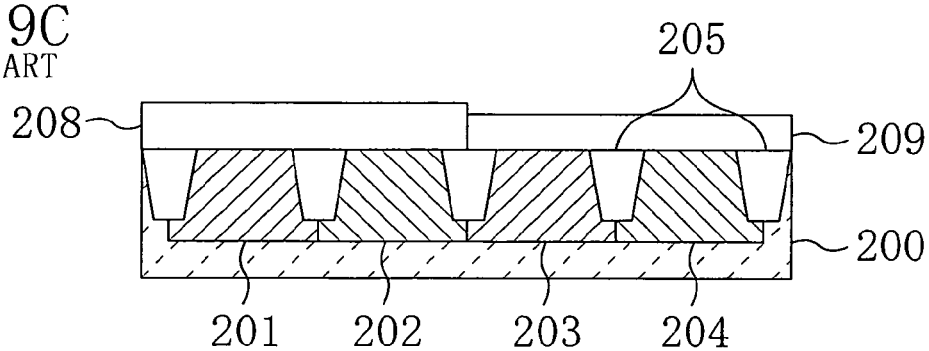
Figure 9D:
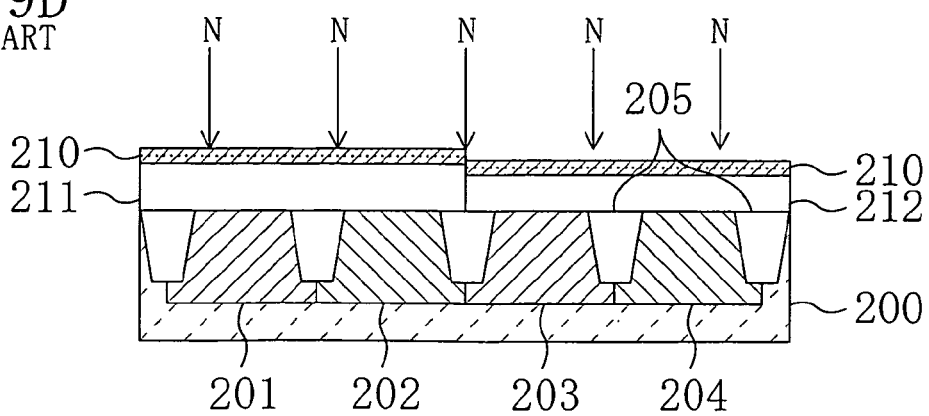
Figure 10A:
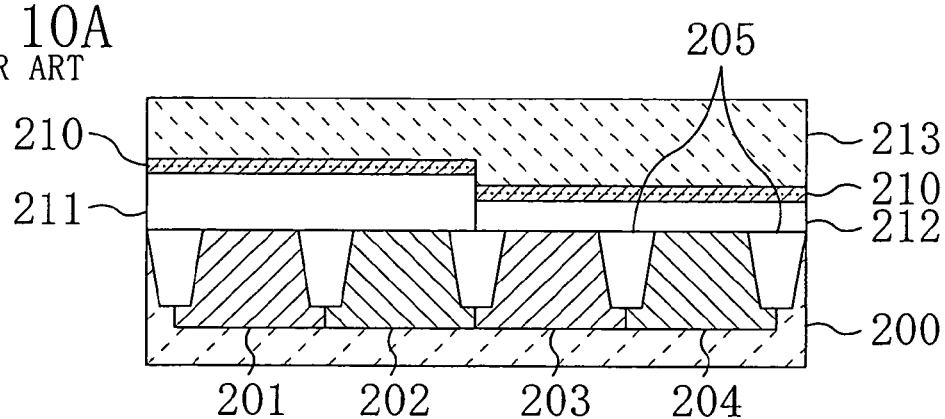
FIGS. 10A through 10C are cross-sectional views illustrating respective process steps of the conventional method for fabricating a semiconductor device (a CMOS transistor) using plasma nitridation so as to introduce nitrogen into gate insulating films.
Figure 10B:
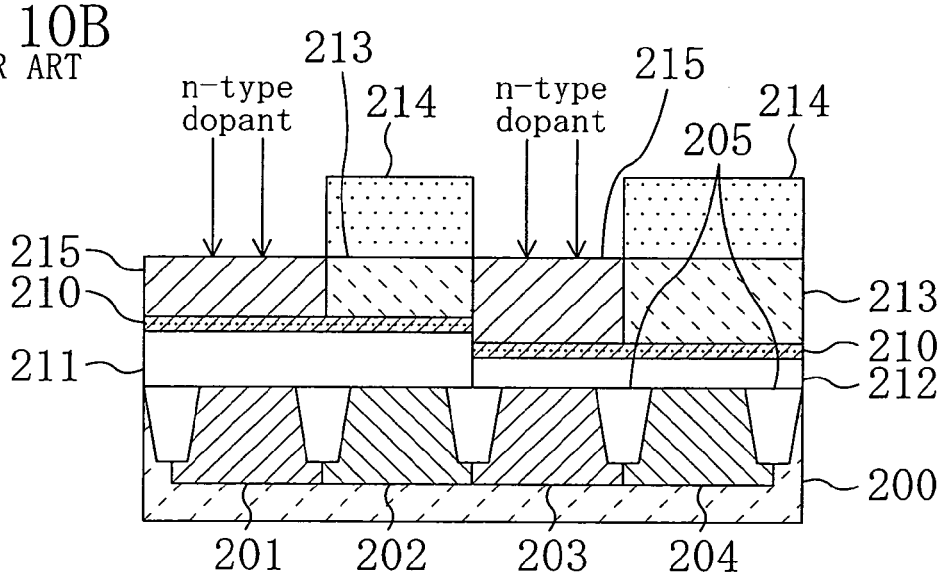
Figure 10C:
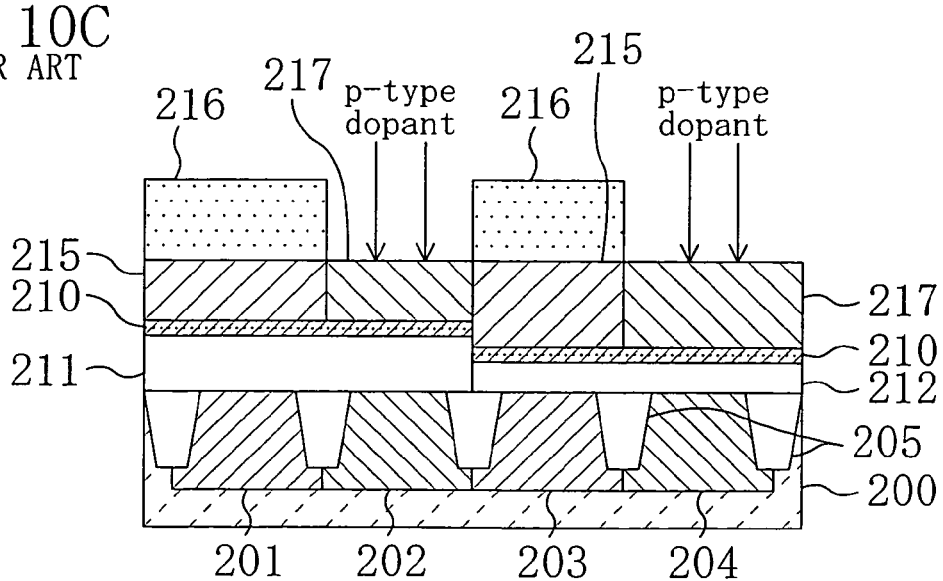
Figure 11A:
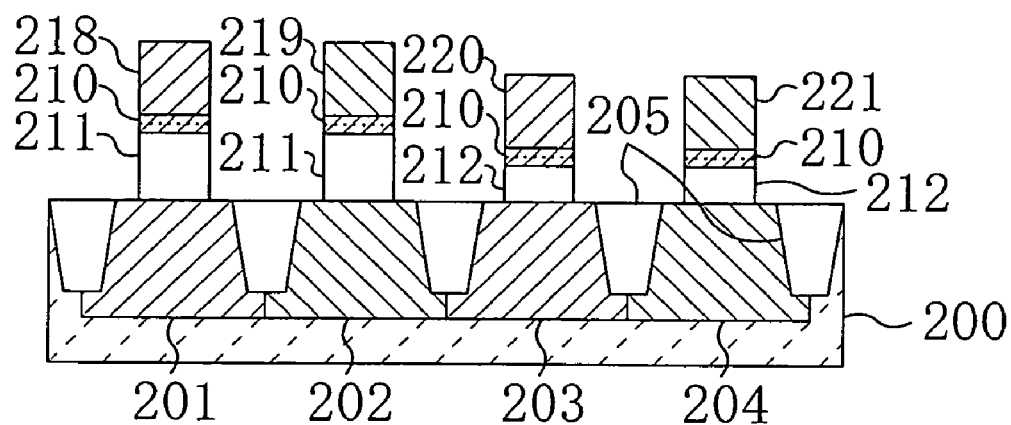
FIGS. 11A and 11B are cross-sectional views illustrating respective process steps of the conventional method for fabricating a semiconductor device (a CMOS transistor) using plasma nitridation so as to introduce nitrogen into gate insulating films.
Figure 11B:
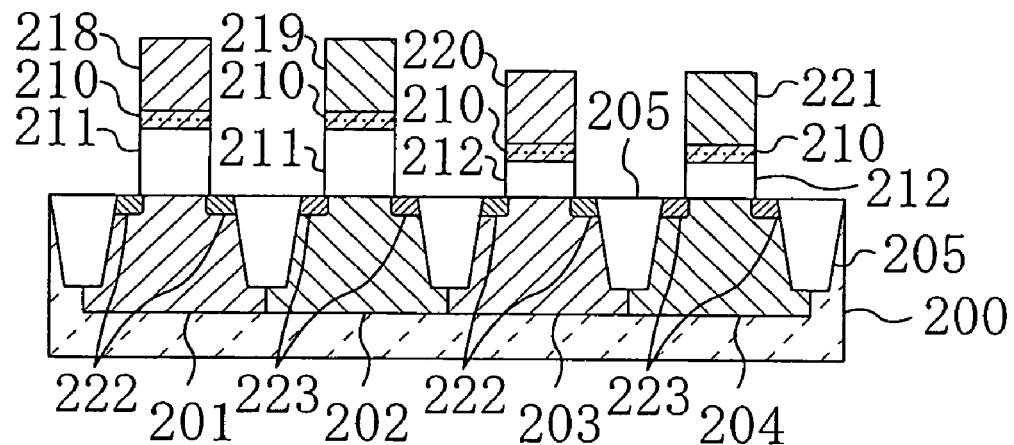
Figure 12A:
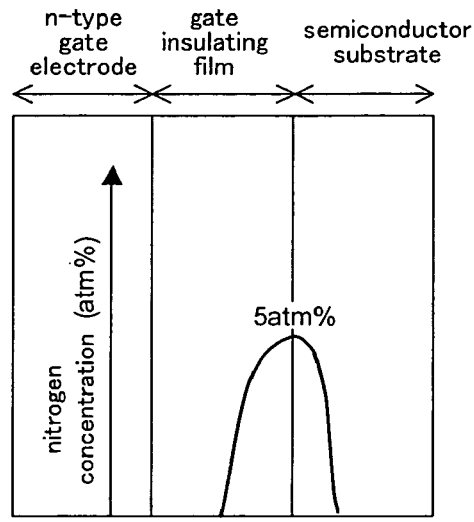
FIGS. 12A through 12D are graphs showing nitrogen profiles in thick gate insulating films of a high-breakdown-voltage nMOS transistor and a high-breakdown-voltage pMOS transistor, respectively, for input/output signals and nitrogen profiles in thin gate insulating films of a high-speed nMOS transistor and a high-speed pMOS transistor, respectively, in a CMOS transistor fabricated by the conventional method for fabricating a semiconductor device (a CMOS transistor) using thermal oxynitridation so as to introduce nitrogen into gate insulating films.
Figure 12B:
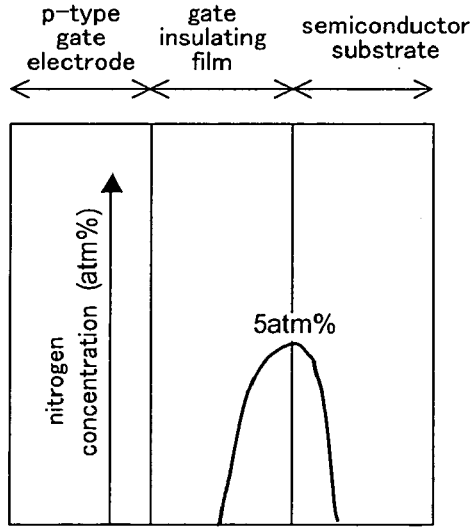
Figure 12C:
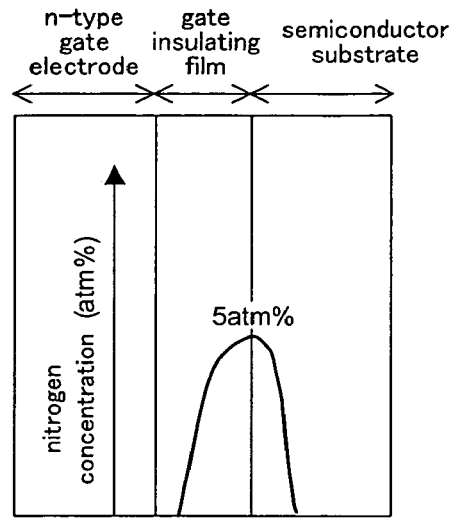
Figure 12D:
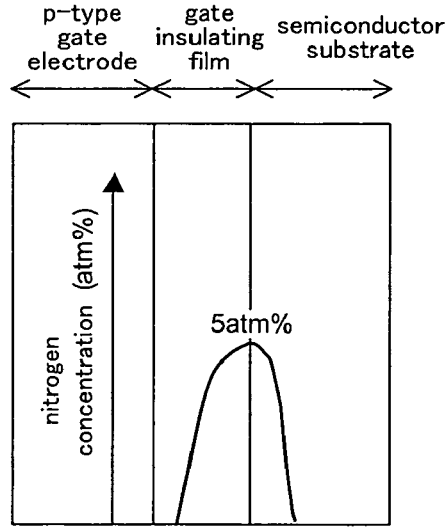
Figure 13A:
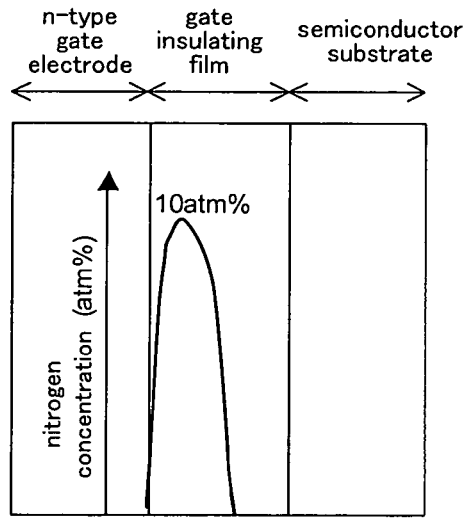
FIGS. 13A through 13D are graphs showing nitrogen profiles in thick gate insulating films of a high-breakdown-voltage nMOS transistor and a high-breakdown-voltage pMOS transistor, respectively, for input/output signals and nitrogen profiles in thin gate insulating films of a high-speed nMOS transistor and a high-speed pMOS transistor, respectively, in a CMOS transistor fabricated by the conventional method for fabricating a semiconductor device (a CMOS transistor) using plasma nitridation so as to introduce nitrogen into gate insulating films.
Figure 13B:
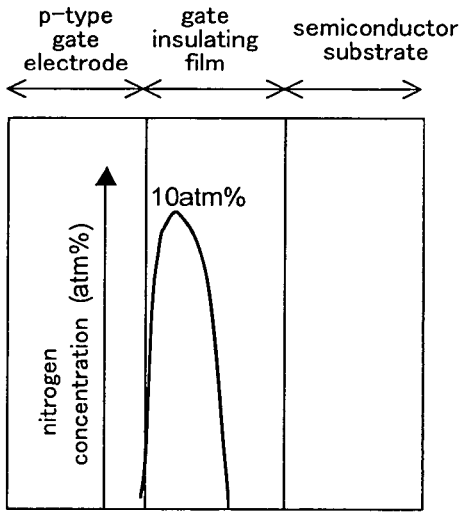
Figure 13C:
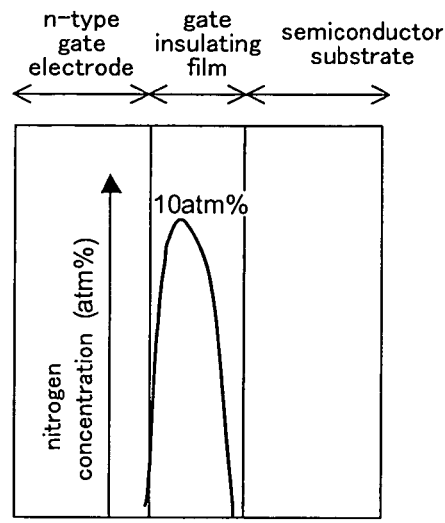
Figure 13D:
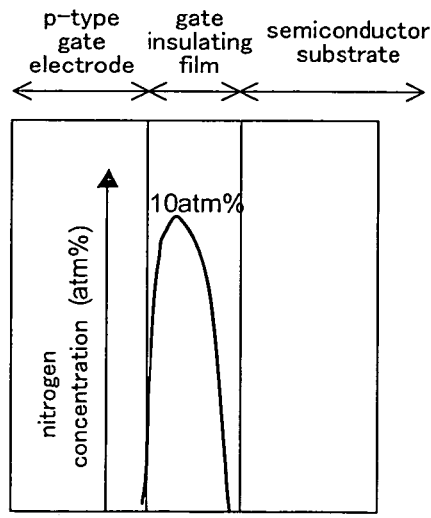

As shown in FIG. 6D, in the thin gate insulating film (i.e., the seventh gate insulating film 316 provided between the second p-type gate electrode 325 and the semiconductor substrate 300) of the high-speed pMOS transistor, nitrogen (the nitridation region 313) is present near the second p-type gate electrode 325, so that leakage current is suppressed and resistance to B permeation from the second p-type gate electrode 325 is enhanced, as compared to a $SiO_2$ film. In addition, as in the thick gate insulating film (i.e., the sixth insulating film 315) of the high-breakdown-voltage pMOS transistor, no nitrogen is present at the interface between the gate insulating film and the semiconductor substrate 300, so that the amount of fixed charge is reduced. Accordingly, reliability with respect to NBTI is enhanced.

That is, in this embodiment, both the reliability of the high-breakdown-voltage nMOS transistor with respect to hot carriers and the reliabilities of the high-breakdown-voltage pMOS transistor and the high-speed pMOS transistor with respect to NBTI are enhanced. In addition, in the thin gate insulating films of the high-speed MOS transistors, leakage current is suppressed and resistance to B permeation is enhanced.

In this embodiment, in the process step shown in FIG. 1D, thermal oxynitridation is performed on the first insulating film 306 in an atmosphere containing nitrogen monoxide with single-wafer lamp heating apparatus, thus ensuring formation of the second insulating film (SiON film) 308 including the first nitridation region 307 having a nitrogen concentration peak at the interface between the second insulating film 308 and the semiconductor substrate 300. This thermal oxynitridation may be performed in an atmosphere containing dinitrogen monoxide, instead of nitrogen monoxide. In such a case, similar advantages are obtained.

In this embodiment, in the process step shown in FIG. 1D, with single-wafer lamp heating apparatus, the pressure in the chamber of the apparatus is kept at 1333 Pa and a hydrogen gas and an oxygen gas are introduced into the chamber, so that the hydrogen gas and the oxygen gas are caused to react with each other by heat from the surface of the semiconductor substrate 300 heated with the apparatus and the semiconductor substrate 300 is oxidized by oxygen radicals generated by the reaction. Accordingly, the third insulating film 310 is formed on the surfaces of the first n-well 302, the second p-well 303 and the second n-well 304 with increase of thickness of the second insulating film 308 on the first p-well 301 suppressed. In this oxidation, the pressure inside the chamber of the single-wafer lamp heating apparatus is not specifically limited as long as it is 2667 Pa or lower.

In this embodiment, the semiconductor substrate 300 is oxidized such that the second insulating film 308 and the third insulating film 310 have the same thickness in the process step shown in FIG. 1D. Accordingly, the following advantages are obtained. That is, in a CMOS transistor, if a gate insulating film (corresponding to the second insulating film 308) of a high-breakdown-voltage nMOS transistor is thicker than a gate insulating film (corresponding to the third insulating film 310) of a high-breakdown-voltage pMOS transistor, the gate length of the nMOS transistor needs to be larger than that of the pMOS transistor so as to suppress a short channel effect. In that case, the driving ability of the nMOS transistor declines, and the doped layer of the nMOS transistor needs to be wide so as to prevent this decline. However, as the doped layer becomes wider, the circuit area increases. On the other hand, as in this embodiment, if the semiconductor substrate 300 is oxidized such that the second insulating film 308 and the third insulating film 310 have the same thickness in the process step shown in FIG. 1D, the foregoing problems are eliminated.

In this embodiment, in the process step shown in FIG. 2B, with single-wafer lamp heating apparatus, the pressure in the chamber of the apparatus is kept at $2.4 \times 10^3$ Pa and a hydrogen gas and an oxygen gas are introduced into the chamber so that the hydrogen gas and the oxygen gas are caused to react with each other by heat from the surface of the semiconductor substrate 300 heated with the apparatus, and the semiconductor substrate 300 is oxidized by oxygen radicals generated by the reaction. Accordingly, the fourth insulating film 312 is formed on the surfaces of the second p-well 303 and the second n-well 304 with increase of thicknesses of the second insulating film 308 on the first p-well 301 and the third insulating film 310 on the first n-well 302 suppressed. In this oxidation, the pressure inside the chamber of the single-wafer lamp heating apparatus is not specifically limited as long as it is 2667 Pa or lower.

In this embodiment, the thick insulating film (i.e., the fifth insulating film 314 provided between the first n-type gate electrode 322 and the semiconductor substrate 300) of the high-breakdown-voltage nMOS transistor includes the second nitridation region 313 having a nitrogen concentration peak near the first n-type gate electrode 322. However, the second nitridation region 313 may be omitted.

In this embodiment, the nitrogen concentration peak (i.e., the nitrogen concentration peak in the first nitridation region 307) at the interface between the thick gate insulating film (i.e., the fifth insulating film 314 to be a first gate insulating film) of the high-breakdown-voltage nMOS transistor and the semiconductor substrate 300 is preferably 4 atm % or more. Then, the foregoing advantages of this embodiment are ensured. If the nitrogen concentration peak in the fifth insulating film 314 at the substrate interface is excessively high, more specifically, if this peak exceeds 10 atm %, the driving ability of the transistor declines. Therefore, the nitrogen concentration peak is preferably 10 atm % or less.

In this embodiment, the nitrogen concentration peaks (i.e., nitrogen concentration peaks in the respective second nitridation regions 313) near the respective gate electrodes 323 through 325 associated with the thick gate insulating film (i.e., the sixth insulating film 315 to be the second gate insulating film) of the high-breakdown-voltage pMOS transistor, the thin gate insulating film (i.e., the seventh insulating film 316 to be the third gate insulating film) of the high-speed nMOS transistor and the thin gate insulating film (i.e., the seventh insulating film 316 to be the fourth gate insulating film) of the high-speed pMOS transistor, respectively, are preferably 8 atm % or more. Each of these nitrogen concentration peaks is preferably located at a depth of 1 nm or less from the interface between the gate insulating film and an associated one of the gate electrodes 323 through 325. Then, the foregoing advantages of this embodiment are ensured. The nitrogen concentration peaks in the sixth insulating film 315 and the seventh insulating film 316 near the respective gate electrodes 323 through 325 are preferably as high as possible. With currently-used nitridation techniques (e.g., plasma nitridation), the nitrogen concentration peak is approximately 20 atm % at the maximum.

In this embodiment, the nitride concentration in the thick gate insulating film (i.e., the sixth insulating film 315 to be the second gate insulating film) of the high-breakdown-voltage pMOS transistor and the nitride concentration in the thin gate insulating film (i.e., the seventh insulating film 316 to be the fourth gate insulating film) of the high-speed pMOS transistor at the interfaces between these gate insulating films and the semiconductor substrate 300 are preferably 3 atm % or less. Then, generation of a large amount of fixed charge by nitrogen that is present at the interface between the gate insulating films and the semiconductor substrate 300 is suppressed, so that deterioration of reliability with respect to NBTI is prevented.

In this embodiment, the thickness of a SiON film (corresponding to the second insulating film 308 of this embodiment) after oxidation in the process step shown in FIG. 1D and the thickness of a $SiO_2$ film (corresponding to the third insulating film 310 of this embodiment) newly formed in this process step are set substantially equal to each other. However, these thicknesses may differ from each other as long as they meet requirements for "gate insulating films of high-breakdown-voltage MOS transistors".

In this embodiment, any one of the process step shown in FIG. 3A (i.e., formation of the n-type silicon film 319) and the process step shown in FIG. 3B (i.e., formation of the p-type silicon film 321) may be performed prior to the other.

What is claimed is:

1. A semiconductor device, comprising:
 a first gate insulating film formed on a first nMOS transistor region in a semiconductor substrate and containing nitrogen;
 a second gate insulating film formed on a first pMOS transistor region in the semiconductor substrate and containing nitrogen;
 a third gate insulating film formed on a second nMOS transistor region in the semiconductor substrate and containing nitrogen; and
 a fourth gate insulating film formed on a second pMOS transistor region in the semiconductor substrate and containing nitrogen,
 wherein each of the third gate insulating film and the fourth gate insulating film has a thickness smaller than that of each of the first gate insulating film and the second gate insulating film,
 the first gate insulating film has a nitrogen concentration peak at the interface between the first gate insulating film and the semiconductor substrate, and
 each of the second, third and fourth gate insulating films has a nitrogen concentration peak only near an associated one of gate electrodes formed on the second, third and fourth gate insulating films, respectively.

2. The device of claim 1, wherein the first gate insulating film has another nitrogen concentration peak near the gate electrode formed thereon.

3. The device of claim 1, wherein the nitrogen concentration peak of the first gate insulating film at the interface between the first gate insulating film and the semiconductor substrate is 4 atm % or more.

4. The device of claim 1, wherein the nitrogen concentration peak of each of the second, third and fourth gate insulating films near an associated one of the gate electrodes is 8 atm % or more.

5. The device of claim 1, wherein the nitrogen concentration peak of each of the second, third and fourth gate insulating films near an associated one of the gate electrodes is located at a depth of 1 nm or less from the interface between each of the second, third and fourth gate insulating films and an associated one of the gate electrodes.

6. The device of claim 1, wherein each of the second and fourth gate insulating films has a nitrogen concentration of 3 atm % or less at the interface between each of the second and fourth gate insulating films and the semiconductor substrate.

7. The device of claim 1, wherein each of the gate electrodes formed on the respective first and third gate insulating films includes an n-type polycrystalline silicon film, and
 each of the gate electrodes formed on the respective second and fourth gate insulating films includes a p-type polycrystalline silicon film.

* * * * *